United States Patent [19]
Aritome

[11] Patent Number: 5,949,101
[45] Date of Patent: Sep. 7, 1999

[54] SEMICONDUCTOR MEMORY DEVICE COMPRISING MULTI-LEVEL LOGIC VALUE OF THE THRESHOLD VOLTAGE

[75] Inventor: Seiichi Aritome, Yokohama, Japan

[73] Assignee: Kabushiki Kaisha Toshiba, Kawasaki, Japan

[21] Appl. No.: 08/521,948

[22] Filed: Aug. 31, 1995

[30] Foreign Application Priority Data

| Aug. 31, 1994 | [JP] | Japan | 6-207344 |
| Jul. 5, 1995 | [JP] | Japan | 7-169872 |

[51] Int. Cl.⁶ .................................................. H01L 29/788
[52] U.S. Cl. .......................... 257/315; 257/314; 257/316
[58] Field of Search ..................................... 257/316, 317, 257/318, 296, 315, 321, 314; 365/185.17, 185.24

[56] References Cited

U.S. PATENT DOCUMENTS

| 4,939,690 | 7/1990 | Momodomi et al. | 365/185 |
| 4,959,812 | 9/1990 | Momodomi et al. | 365/185 |
| 5,253,206 | 10/1993 | Tanaka et al. | 365/189.09 |
| 5,321,699 | 6/1994 | Endoh et al. | 371/21.5 |
| 5,323,039 | 6/1994 | Asano et al. | 257/315 |
| 5,355,330 | 10/1994 | Hisamoto et al. | 257/296 |
| 5,357,462 | 10/1994 | Tanaka et al. | 365/185 |
| 5,365,098 | 11/1994 | Miyamoto et al. | 257/316 |
| 5,477,068 | 12/1995 | Ozawa | 257/315 |
| 5,508,957 | 4/1996 | Momodomi et al. | 257/315 |
| 5,592,001 | 1/1997 | Asano | 257/316 |
| 5,677,556 | 10/1997 | Endoh | 257/315 |
| 5,698,879 | 12/1997 | Aritome et al. | 257/315 |

FOREIGN PATENT DOCUMENTS

| 1-235278 | 9/1989 | Japan . | |
| 4-335578 | 11/1992 | Japan . | |
| 5-77189 | 10/1993 | Japan . | |
| 6-21404 | 1/1994 | Japan | 257/315 |

*Primary Examiner*—Olik Chaudhuri
*Assistant Examiner*—Phat X Cao
*Attorney, Agent, or Firm*—Oblon, Spivak, McClelland, Maier & Neustadt, P.C.

[57] ABSTRACT

A semiconductor memory device including a semiconductor substrate, and an array of a plurality of memory cells formed and arranged on the semiconductor substrate. Each memory cell contains a first transistor provided with a gate, and the semiconductor substrate includes element separating trenches arranged at least in part of the respective memory cells and each of the element separating trenches is embedded at least partly with an element separating insulative film. An electrically conductive film is embedded in at least part of the remaining area of the trench, a second transistor is constructed by at least part of the lateral sides of each of the element separating trenches having an embedded conductive film forming a part of a channel region, and a third transistor is constructed by another part of the the lateral sides of each of the element separating trenches forming part of a channel region. Diffusion layers of sources and drains of the second transistor and the third transistor are shared and the second and third transistors are connected in parallel to construct the first transistor of the memory cell. The threshold voltage of the second transistor having the conductive film formed as a second gate is set to a voltage higher than a voltage applied to the second gate selected in a read operation.

32 Claims, 17 Drawing Sheets

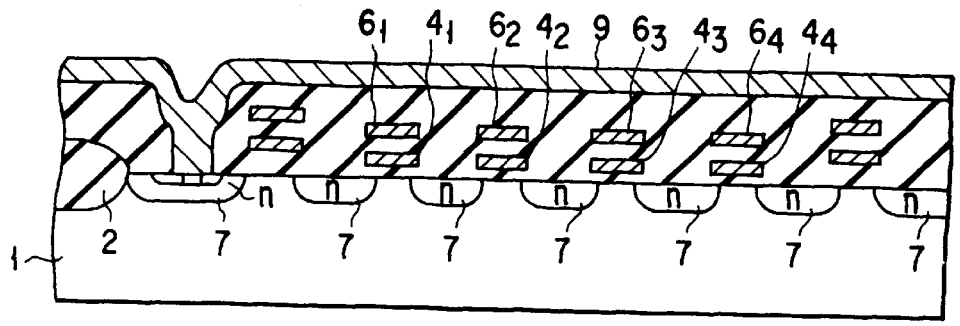
FIG. 4B (PRIOR ART)
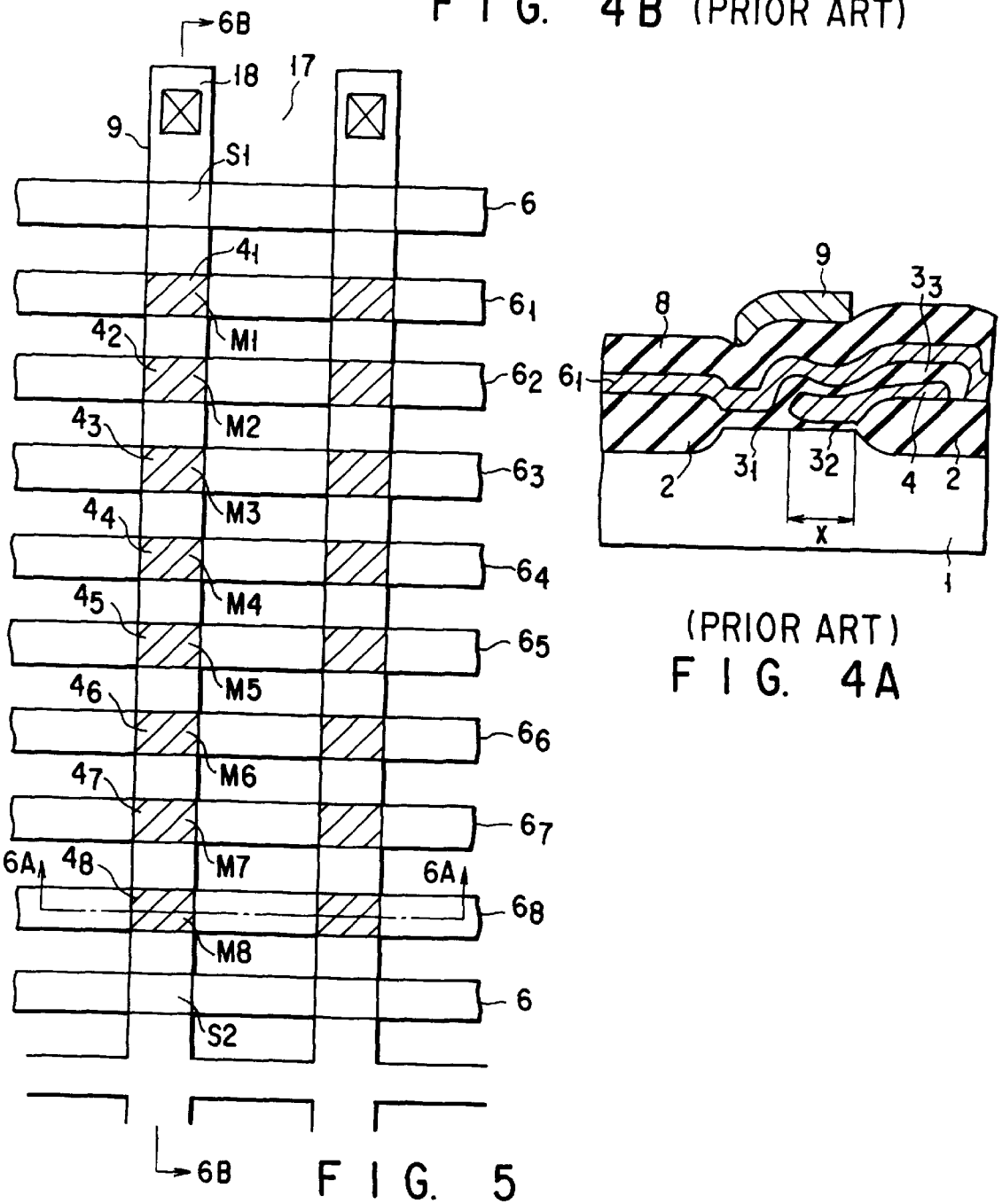
FIG. 4A (PRIOR ART)
FIG. 5

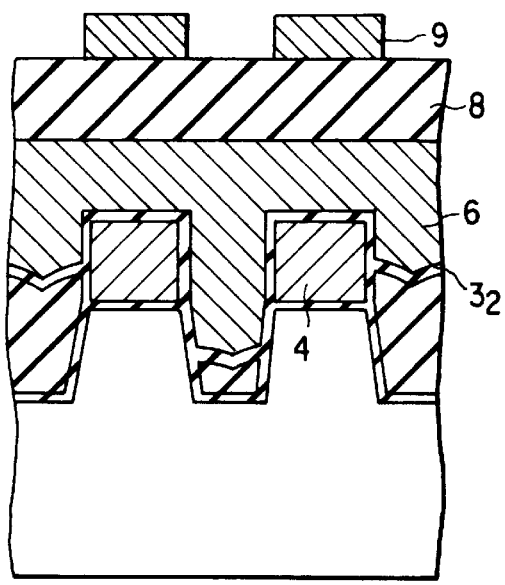
F I G. 10
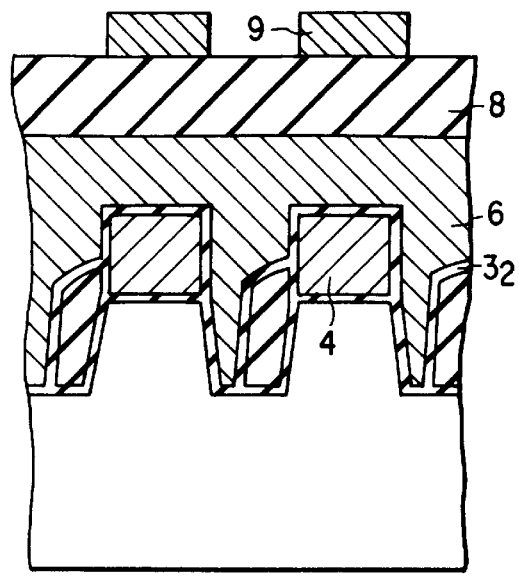
F I G. 11
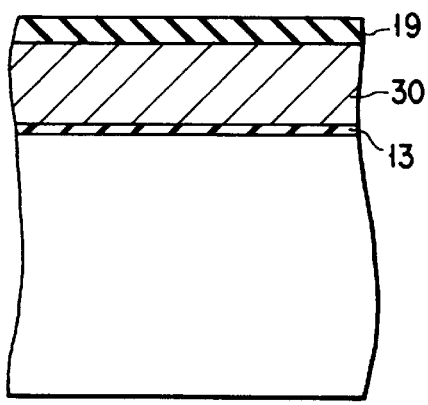
F I G. 12A
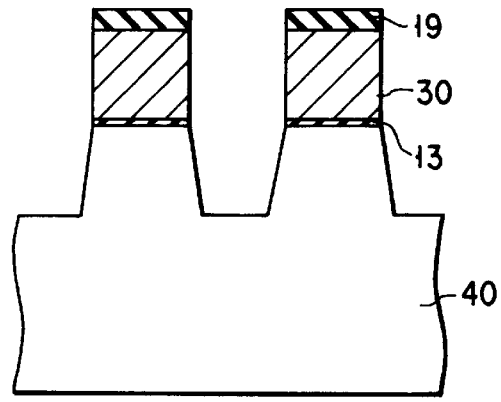
F I G. 12B
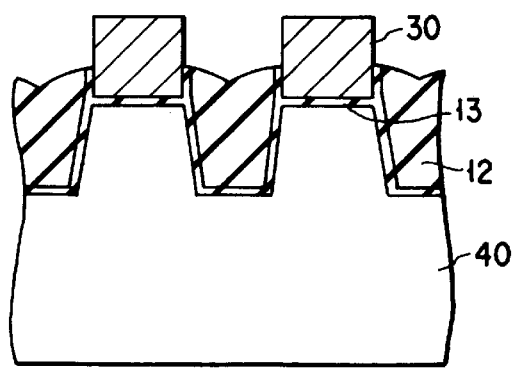
F I G. 12C

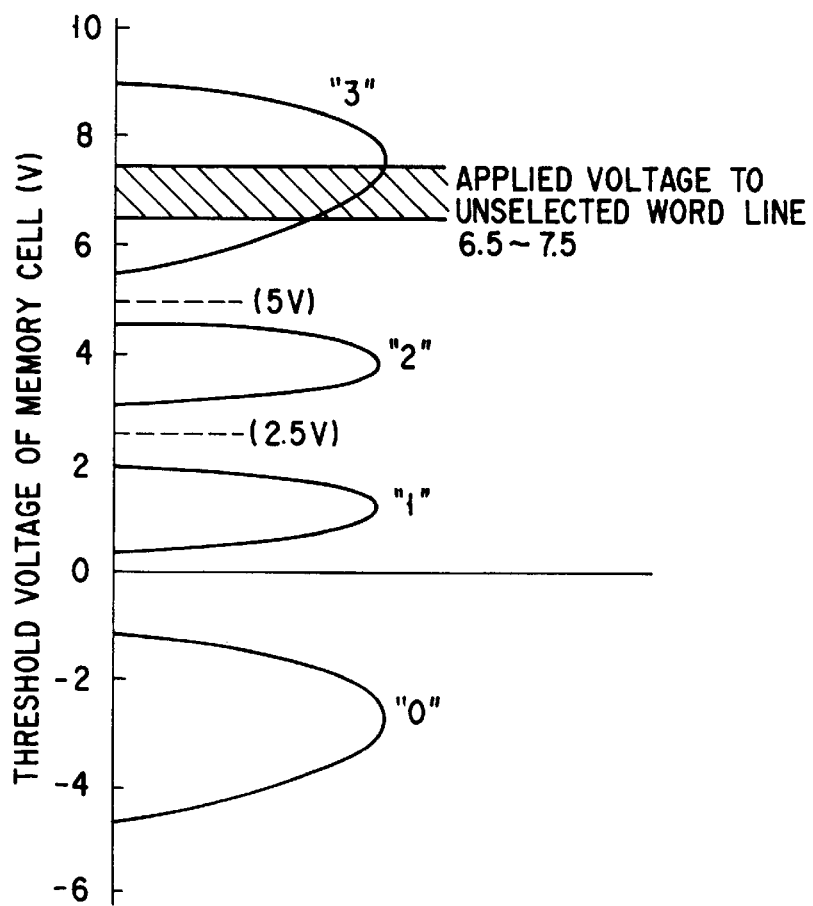
F I G. 14

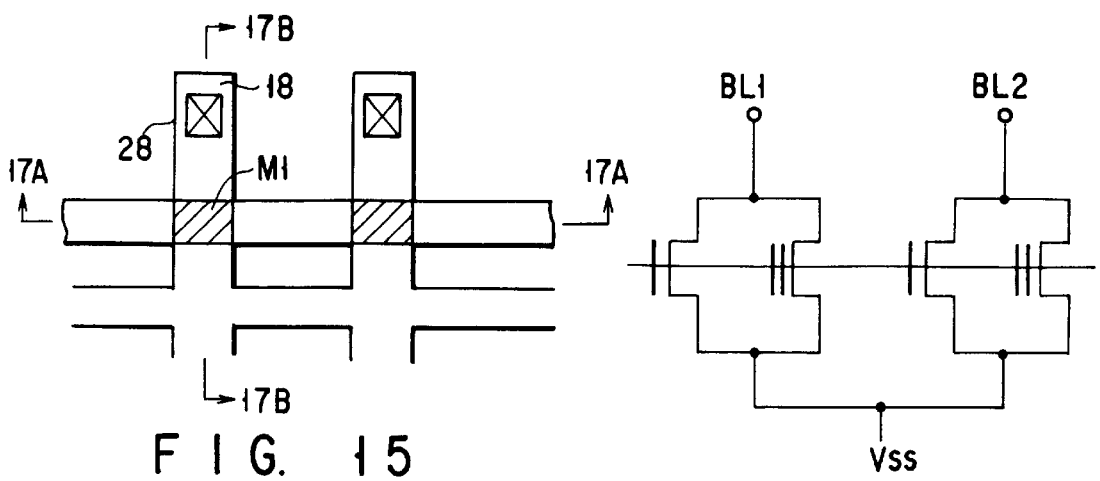
FIG. 15
FIG. 16
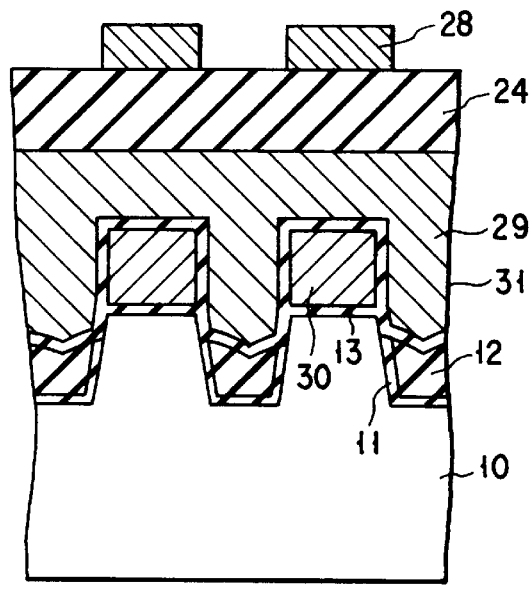
FIG. 17A
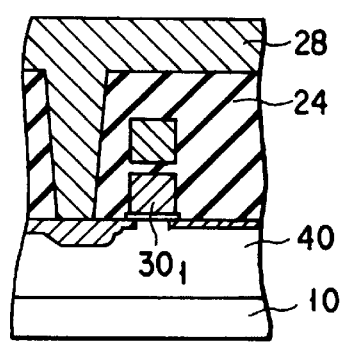
FIG. 17B
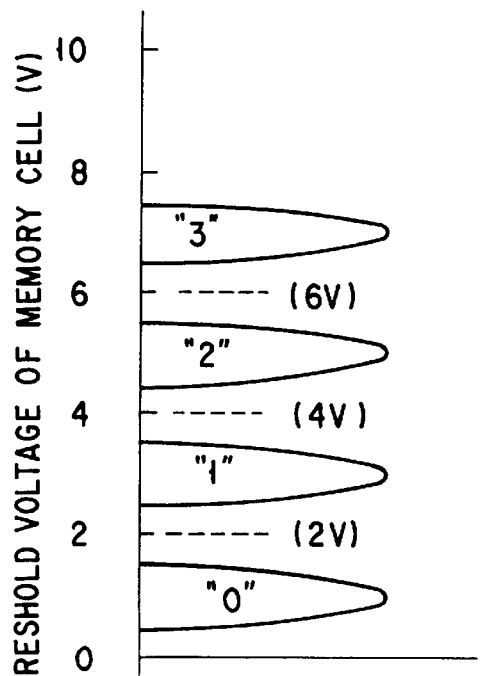
FIG. 18

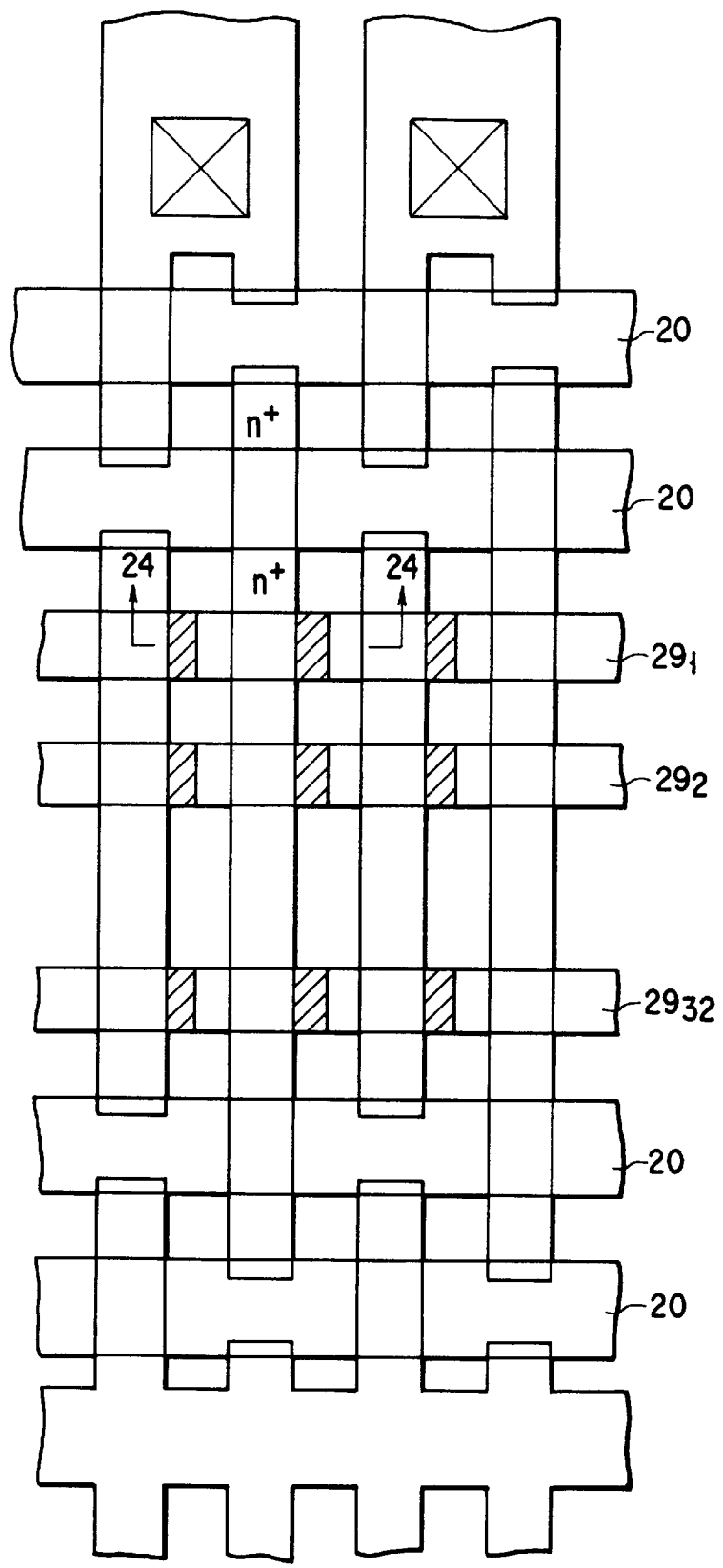
F I G. 22

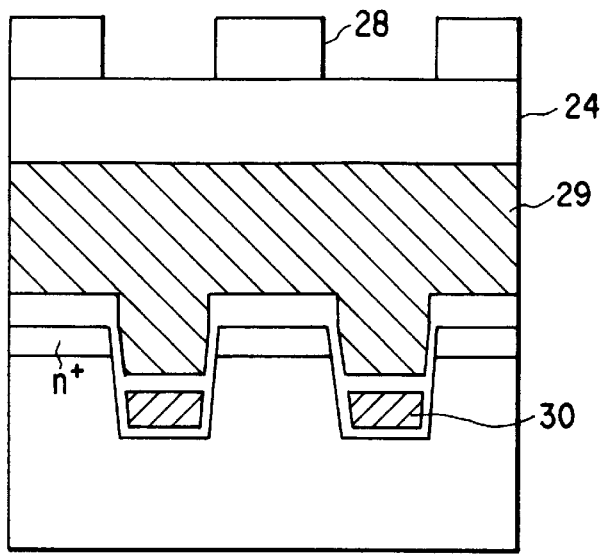
F I G. 25
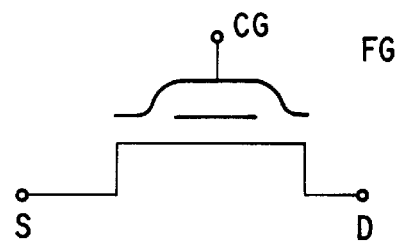
F I G. 26
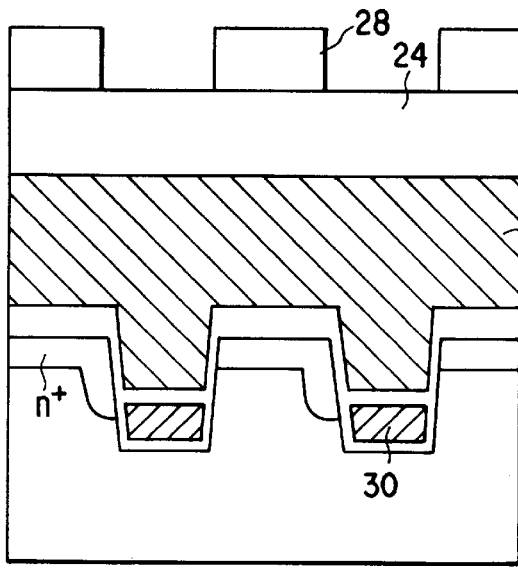
F I G. 27
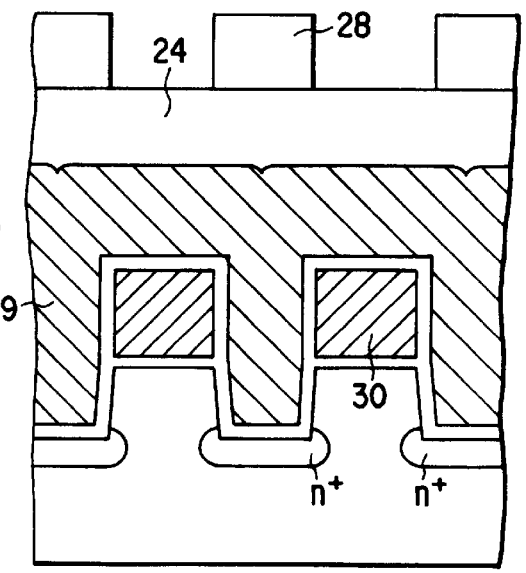
F I G. 28

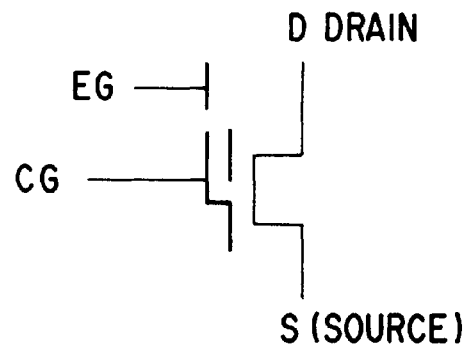
F I G. 37
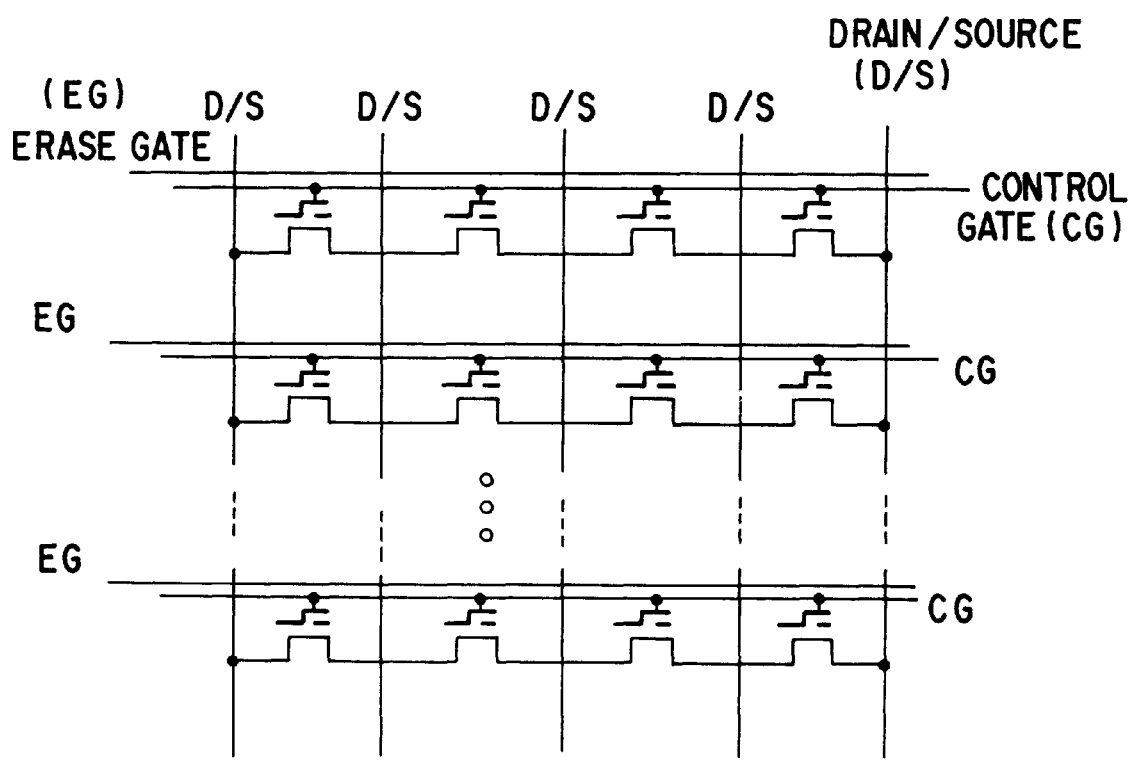
F I G. 38

SEMICONDUCTOR MEMORY DEVICE COMPRISING MULTI-LEVEL LOGIC VALUE OF THE THRESHOLD VOLTAGE

BACKGROUND OF THE INVENTION

1. Field of the Invention

This invention relates to a MOS structure type semiconductor memory device and, more particularly, relates to a non-volatile semiconductor memory device having a charge storage layer (e.g., a floating gate) and a control gate.

2. Description of the Related Art

Electrically rewritable non-volatile memory devices realized by using a MOSFET structure memory comprising floating gates are normally referred to as EEPROMs in the technology of non-volatile memories. The memory array of an EEPROM of this type is typically formed by arranging a memory cell at each of the intersections of the row and column lines of the device. More specifically, the two adjacent memory cells are made to share a common drain which is held in contact with a corresponding column line so that the contact section takes a minimum area of the cells. With such an arrangement, however, a contact section is required for each drain that is common to a pair of memory cells and takes a considerable portion of the area occupied by the cells.

In an attempt to further reduce the area of a contact section, there has been proposed an EEPROM in which memory cells are serially connected to make NAND cells. The NAND cells can be collectively erased by causing them to simultaneously emit electrons through their floating gates and, thereafter, electrons may be injected only into the floating gates of selected memory cells to write data there. For collectively erasing the memory cells, their control gates are held to level "L" while the wells are held to level "H". For select data programming, data is sequentially programmed into the cells closer to the source and then into the cells closer to the drain. During this operation, the voltage of the drain of the selected cell is raised from level "L" to an intermediary level and that of the control gate of the selected cell is raised to level "H" so that electrons may be injected into the floating gate from the substrate.

The voltage of the control gate has to be substantially equal to that of the drain for all the unselected memory cells located closer to the drain than the selected memory cell in order to deliver the potential of the drain to the selected cell. This is because of the voltage applied to the drain, only the portion equal to the voltage applied to the control gate less the threshold voltage of the memory cell can be delivered to the source.

With any known NAND cells, however, the threshold voltage of each cell is unequivocally defined by the voltage of the floating gate because the latter is arranged to cross the channel region. Therefore, the data stored in a selected cell cannot be read out if the threshold voltage is higher than the voltage (Vcc) applied to the control gate of an unselected cell.

FIG. 1 of the accompanying drawings schematically shows the distribution of threshold voltages of the memory cells of a memory device of the type under consideration. For reading out data, a voltage of Vcc (=4.5 to 5.5V) is applied to the control gate of each unselected memory cell and the memory cells of both the programming and erasing sides are turned ON. Then, the selected memory cell would not become ON and no data would be read out of it if the threshold voltage of the programming side memory cell is higher than Vcc (e.g., 6V).

Thus, if the threshold voltage of a memory cell is determined as a function of the voltage of the floating gate, a wide dispersion may become observable in the threshold voltage at the time of data programming. This would some memory cells show a high threshold voltage and the selected memory cell would not become ON with the control gate voltage of the unselected memory cell;

A NAND cell proposed to by pass the above described problem is shown in FIGS. 2 through 4B, of which FIG. 2 is a plan view and FIG. 3 a circuit diagram of an equivalent circuit of the cell while FIGS. 4A and 4B are cross sectional views taken along lines 4A—4A and 4B—4B of FIG. 2.

A diffusion layer 7 for producing sources and drains is formed on a substrate region 1 (or p-type well region) of a substrate separated from the remaining regions by an element separating region 2. Then, floating gates 4 ($4_1$ to $4_4$) are formed with a first insulation film 32 disposed therebetween and thereafter control gates 6 ($6_1$ to $6_4$) are formed with second and third gate insulation films 31 and 33 arranged therebetween for each memory cell unit. A bit line 9 is formed on the control gates 6 via an interlayer insulative layer 8. In a NAND cell having the above described configuration, the floating gates 4 occupy only part of the channel region. In other words, the former does not completely cross and partly covers the latter along the transversal direction of the latter and transistors (T1 to T4) are formed in the uncovered area as shown in FIGS. 2 and 3 so that the threshold voltage in the position direction of the memory cell is determined by the part of the channel region that is not covered by the floating gates 4.

With a memory cell of the above described arrangement, however, the performance of the device can vary significantly if the element region and the corresponding floating gate are not correctly aligned. If such misalignment takes place between the element region and the floating gate, there may be produced an area x where the floating gate 4 overlies the gate insulation film 32 as shown in FIGS. 2 and 4A. Then, the performance of the memory cell particularly in terms of coupling ratio can vary as a function of the value of x to give rise to significant variances in the programming and reading voltages. Additionally, the performance of the transistors (T1–T4 of FIGS. 2 and 3) in the areas that are not covered by the respective floating gates can also vary to make the overall performance of the memory cell very unstable.

The influence of the misalignment can affect much more remarkably the overall performance of the memory cell if the channel width is reduced to achieve an enhanced degree of integration. Thus, the problem of misalignment becomes unsurmountable in proportion to the effort for a higher degree of integration and downsizing.

A memory cell which forms the overlap area x of the floating gate 4 an the gate insulative film 32 in the channel area and has no floating gate 4 on the element separating film 2 is proposed (FIG. 4C). In this memory cell, even if the misalignment of area x and the element separating area occurs, it is necessary to enlarge the size y of FIG. 4C to avoid overlapping areas thereof. Therefore, it is difficult to perform higher integration and downsizing.

As described above, with a NAND-type memory cell in which the floating gate partly covers the channel region, the problem of varying performance of the device as a function of misalignment of the floating gate and the element region provides a major obstacle to be cleared in the effort of downsizing.

SUMMARY OF THE INVENTION

It is therefore the object of the present invention to provide a semiconductor memory device that is free from variances in the performance of the memory cells due to misalignment of the charge storage layer (floating gate) and the element region and hence adapted to a high degree of integration and reliability.

According to the invention, the above object is achieved by providing a semiconductor memory device having a configuration as described below.

A semiconductor memory device according to the invention comprises a semiconductor substrate; and an array of a plurality of memory cells formed and arranged on the semiconductor substrate, each memory cell containing a first transistor provided with a gate, in which the semiconductor substrate includes element separating trenches arranged at least part of respective memory cells and each of the element separating trenches is embedded at least partly with an element separating insulative film while an electrically conductive film is embedded in at least part of the remaining area of the trench, a second transistor is constructed by at least part of the lateral sides of each of the element separating trenches having an embedded conductive film forming a part of a channel region, a third transistor is constructed by another part of the part of the lateral sides of each of the element separating trenches forming a part of a channel region, diffusion layers of sources and drains of the second transistor and the third transistor are shared and the second and third transistors are connected in parallel (or series) to construct the first transistor of the memory cell, and a threshold voltage, the second transistor having the conductive film formed as a gate is set to higher (or lower) than a voltage applied to the gate selected in a read operation.

With above configuration:
(1) Source and drain diffusion layers of the first transistor of the memory cell are shared and a plurality of the first transistors of the memory cells are connected in parallel.
(2) Source and drain diffusion layers of the first transistor of the memory cell are shared and a plurality of the first transistors of the memory cells are connected in series.
(3) The plurality of memory cell connected in parallel are coupled to a data line via a common select transistor.

Another non-volatile semiconductor memory device comprises a semiconductor substrate; and a memory array of a plurality of memory cells formed and arranged on the semiconductor substrate, each memory cell containing a transistor provided with a gate, each of the memory cells including a charge storage layer formed on the semiconductor substrate with a first insulative layer arranged therebetween and a conductive layer formed on the charge storage layer with a second insulative layer arranged therebetween; in which the semiconductor substrate includes element separating trenches formed at least in part of respective separating regions arranged between any two adjacent ones of the plurality of memory cells and each of the element separating trenches is embedded at least partly with an element separating insulative film while the second electrically conductive film is embedded in at least part of the remaining area of the trench, the charge storage layer partly surrounds a first channel region of a surface of the semiconductor substrate in a direction of a channel width and a transistor is constructed by the conductive film formed as a control gate, source and drain diffusion layers of a transistor having the first channel region and a transistor having the second channel region are shared and the second and third transistors are connected in parallel (or connected in series to construct NAND cell) to construct the memory cell, each of a plurality of the memory cells stores an n-level (n is a natural number of larger than 2) having 2 or more levels, and a threshold voltage of a transistor, which has the second channel region, having the conductive film formed as a gate is set to higher (or lower) than a voltage applied to the gate selected in a read operation for deciding highest level of threshold value and second higher level thereof.

With the above configuration:
(1) In parallel connecting of transistors, source and drain diffusion layers of the first transistor of the memory cell are shared and a plurality of the first transistors of the memory cells are connected in parallel.
(2) the plurality of memory cell connected in parallel (or in parallel) are coupled to a data line via a common select transistor.
(3) The number of levels is 2.
(4) The storage layer is formed by a polysilicon film.
(5) The storage layer is formed by one of a silicon nitride film and multilayered film of silicon nitride film and SiO$_2$ film.

Still another non-volatile semiconductor memory device comprises a semiconductor substrate; and a memory array of a plurality of memory cells formed and arranged on the semiconductor substrate, each memory cell containing a transistor provided with a gate, each of the memory cells including a charge storage layer formed on the semiconductor substrate with a first insulative layer arranged therebetween and a conductive layer formed on the charge storage layer with a second insulative layer arranged therebetween; in which the semiconductor substrate includes element separating trenches formed at least in part of respective separating regions arranged between any two adjacent ones of the plurality of memory cells and each of the element separating trenches is embedded at least partly with an element separating insulative film while the second electrically conductive film is embedded in at least part of the remaining area of the trench, the charge storage layer partly surrounds a first channel region of a surface of the semiconductor substrate in a direction of a channel width and a transistor is constructed by the conductive film formed as a control gate, source and drain diffusion layers of a transistor having the first channel region and a transistor having the second channel region are shared and the second and third transistors are connected in series to construct the memory cell, each of a plurality of the memory cells stores an n-level (n is a natural number of larger than 2) having 2 or more levels, and a threshold voltage of a transistor, which has the second channel region, having the conductive film formed as a gate is set to lower than a voltage applied to the gate selected in a read operation for deciding lowest level of threshold value and second lower level thereof.

With above configuration, source and drain diffusion layers of adjacent memory cells are shared and a plurality of memory cells are connected in parallel, and the threshold voltage of the transistor may be set higher than a voltage applied to the gate selected in a read operation for deciding the lowest level of threshold value and a second lower level thereof.

In addition, with the above configuration,
(1) Source and drain diffusion layers of the first transistor of the memory cell are shared and a plurality of the first transistors of the memory cells are connected in series (or parallel).
(2) The plurality of memory cell connected in parallel are coupled to a data line via a common select transistor.

(3) The number of levels is 2.

(4) The storage layer is formed by a polysilicon film.

(5) The storage layer is formed by one of a silicon nitride film and multilayered film of silicon nitride film and $SiO_2$ film.

With a semiconductor memory device according to the invention, the lateral sides of each of the element separating trenches formed in the substrate are used for transistor channels and the threshold voltage of each transistor is regulated by channel implantation to provide a memory cell arranged on the surface of substrate with a floating gate disposed therebetween. With this arrangement, the device is free from the problem of misalignment of comparable conventional memory devices, in which channels are arranged in areas of the substrate surface that are not covered by floating gates. Thus, a semiconductor memory device according to the invention performs stably without showing any deviation of performance.

Additionally, since the lateral sides of each trench is used as channels, the memory cells can be dimensionally minimized to downsize the memory device and reduce the manufacturing cost.

In other words, since the lateral sides of each element separating trench of a semiconductor memory device according to the invention is used as a transfer transistor, the device performs stably without showing any deviation of performance. Additionally, the memory cells can be dimensionally minimized to downsize the memory device and reduce the manufacturing cost.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 4A to 4C are cross sectional views respectively taken along lines 4A—4A and 4B—4B of FIG. 2, and a plan view of another memory cell, respectively.

FIG. 5 is a plan view of memory cells of a first embodiment of the invention.

FIG. 10 is a plan view of memory cells of a second embodiment of the invention.

FIG. 11 is a plan view of memory cells of a third embodiment of the invention.

FIGS. 12A through 12G are cross sectional views of memory cells of a fourth embodiment of the invention, showing different manufacturing steps thereof.

FIG. 14 is a graph showing a distribution pattern of threshold values of memory cells of a fifth embodiment of the invention, obtained by applying a multiple-valued logic.

FIG. 15 is a plan view of NOR-type memory cells realized by applying the concept of the invention.

FIG. 16 is a circuit diagram of an equivalent circuit of the memory cells of FIG. 15.

FIGS. 17A and 17B are cross sectional views respectively taken along lines 17A—17A and 17B—17B of FIG. 15.

FIG. 18 is a graph showing a distribution pattern of threshold values of NOR-type memory cells obtained by applying a four-valued logic.

FIG. 22 is a plan view of memory cells of a sixth embodiment of the invention realized by applying the concept of the invention to a grand array of memory cells.

FIG. 25 is a cross sectional view of memory cells of a device obtained by modifying a seventh embodiment of the invention.

FIG. 26 is a circuit diagram of an equivalent circuit of a memory cell of the device of FIG. 25.

FIG. 27 is a cross sectional view of memory cells of another device obtained by modifying the seventh embodiment of the invention.

FIG. 28 is a cross sectional view of memory cells of still another device obtained by modifying the seventh embodiment of the invention.

FIG. 37 is a circuit diagram of an equivalent circuit of a memory cell of still another embodiment of the invention.

FIG. 38 is a schematic diagram of an array of memory cells of the embodiment of FIG. 37.

DETAILED DESCRIPTION OF THE PREFERRED EMBODIMENTS

First, a first preferred embodiment of semiconductor memory device according to the invention will be described by referring to the accompanying drawings. Note that the embodiments of the invention described hereinafter are non-volatile semiconductor memory devices (NAND-type EEPROMS).

Figure 1:
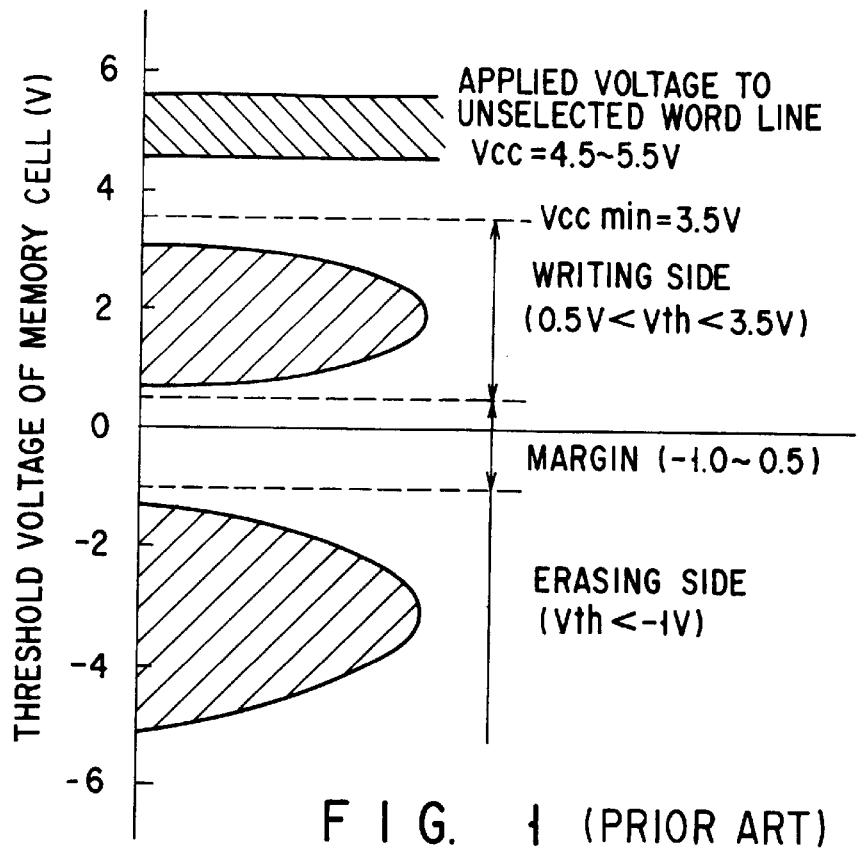
FIG. 1 is a graph showing a distribution pattern of threshold values of memory cells.
Figure 2:
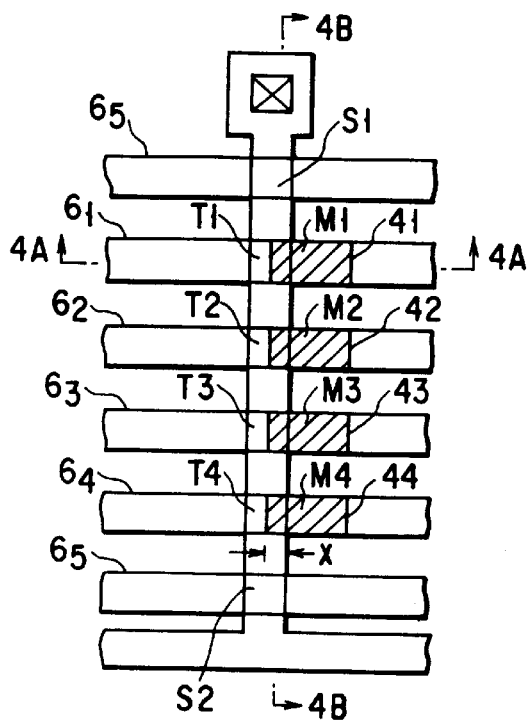
FIG. 2 is a plan view of memory cells.
Figure 3:
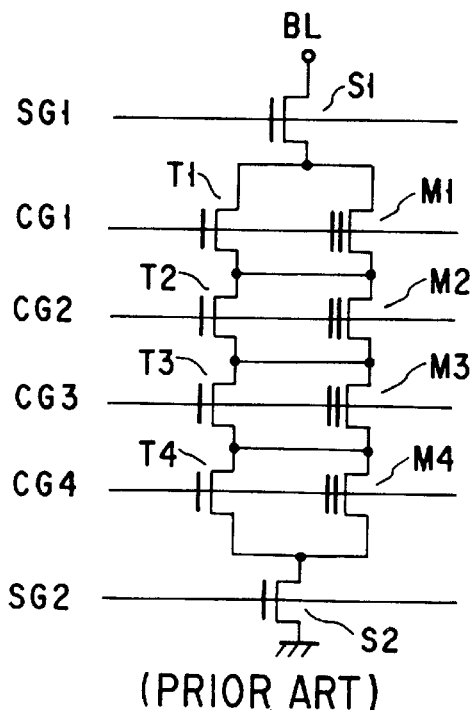
FIG. 3 is a circuit diagram of an equivalent circuit of the memory cells of FIG. 2.
Figure 4C:
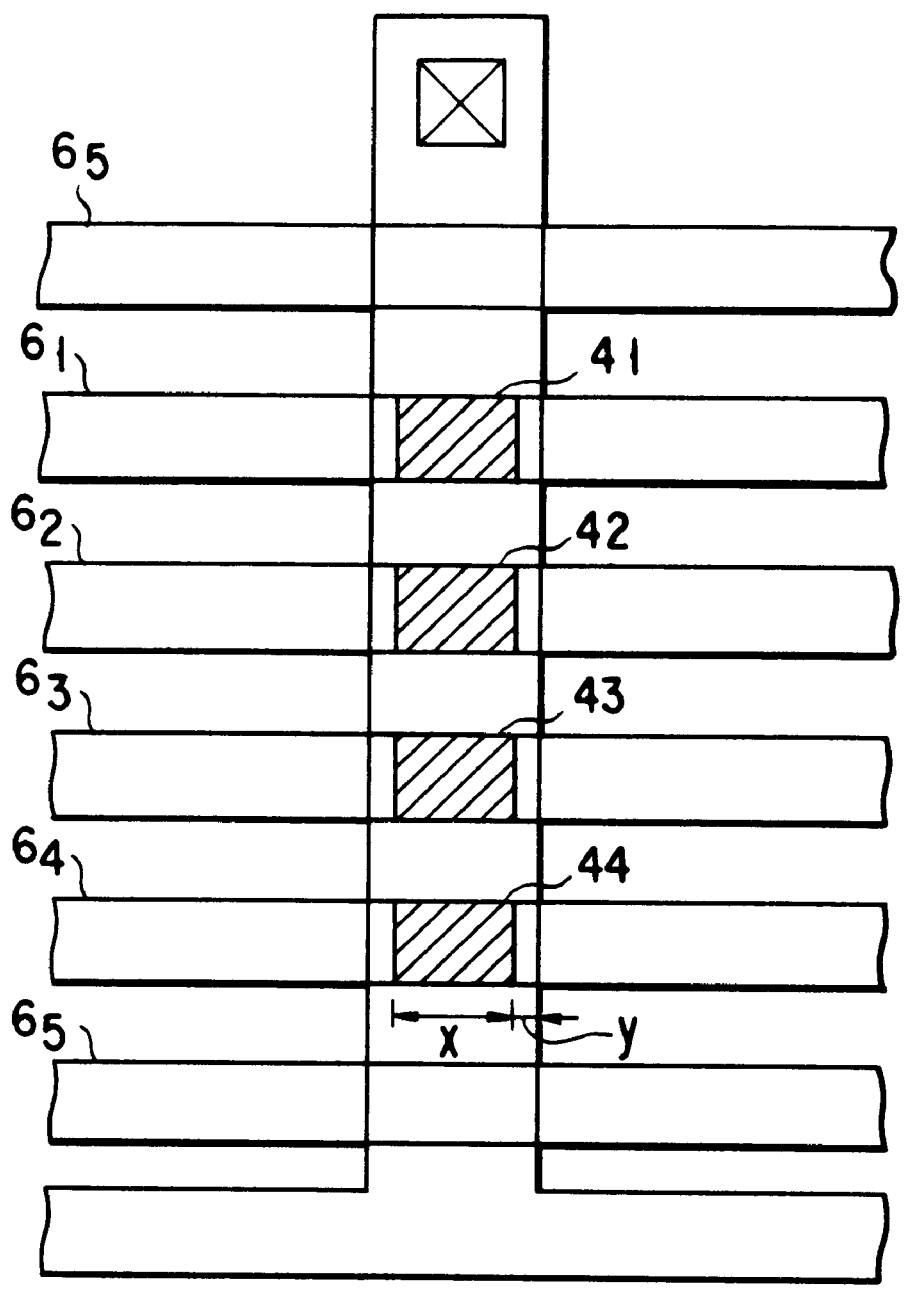
Figure 6A:
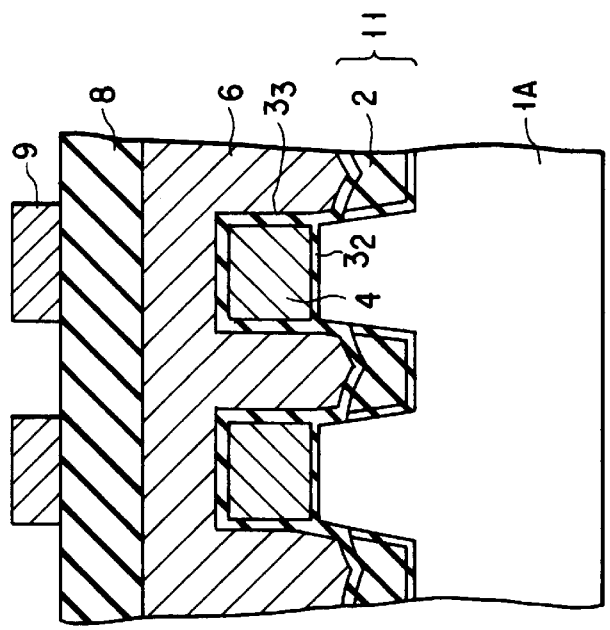
FIGS. 6A and 6B are cross sectional views respectively taken along lines 6A—6A and 6B—6B of FIG. 5.
Figure 6B:
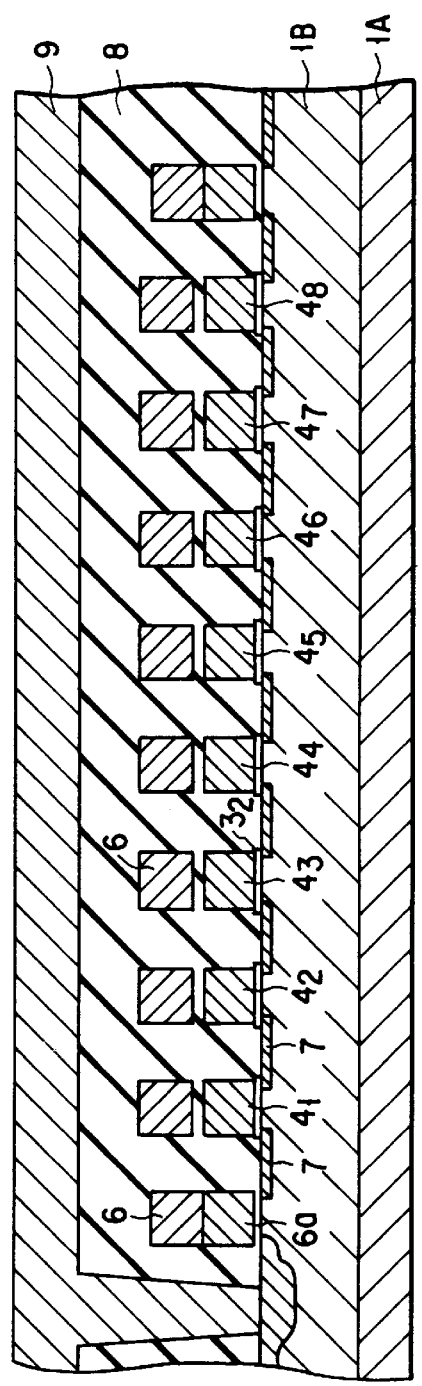

FIG. 5 is a plan view of a pair of NAND cells and FIGS. 6A and 6B are cross sectional views respectively taken along 6A—6A and 6B—6B of FIG. 5. Note that FIG. 5 shows part of a memory cell array of a NAND-type EEPROM comprising memory cells M (M1–M8) and selective transistors (S1, S2).

In FIGS. 5 to 6B, element separating trenches (hereinafter referred to simply as "trenches") are formed on an n-type silicon substrate 1A and an insulation film 2 is buried in each trench. For each element, a first gate insulation film 32 (hereinafter referred to as a "tunnel oxide film") is formed on the surface of the n-type silicon substrate 1A and then a first gate electrode 4 (electrodes $4_1$ through $4_8$ (hereinafter referred to as a "floating gate") in FIG. 6B) of a first conductive film is formed on the tunnel oxide film 32. Then, a second gate electrode 6 (hereinafter referred to as a "control gate") of a second conductive film is formed to fill the trench with a third gate insulation film 33 disposed thereunder. An interlayer insulative film 8 is formed on the second conductive film. In FIGS. 5 through 6B, reference numerals 17, 18 and 7 respectively denote an element separating region, an element region and a diffusion layer where sources and drains are formed.

In the embodiment having a configuration as described above, a floating gate 4 and a control gate 6 are formed for each element on the surface of the substrate with a tunnel oxide film 32 arranged therebetween to produce a transfer transistor containing a control gate 6 covering lateral sides of a trench as a gate electrode by means of element separation. With this arrangement, the degrading of the performance of a memory cell and increasing cell area attributable to misalignment can be effectively suppressed. In each memory cell of the embodiment, a large coupling ratio can be realized by utilizing the lateral walls of the floating gate 4 for a capacitance between the floating gate and the control gate so that the coupling ratio can be effectively controlled by controlling the gate width.

Figure 7:
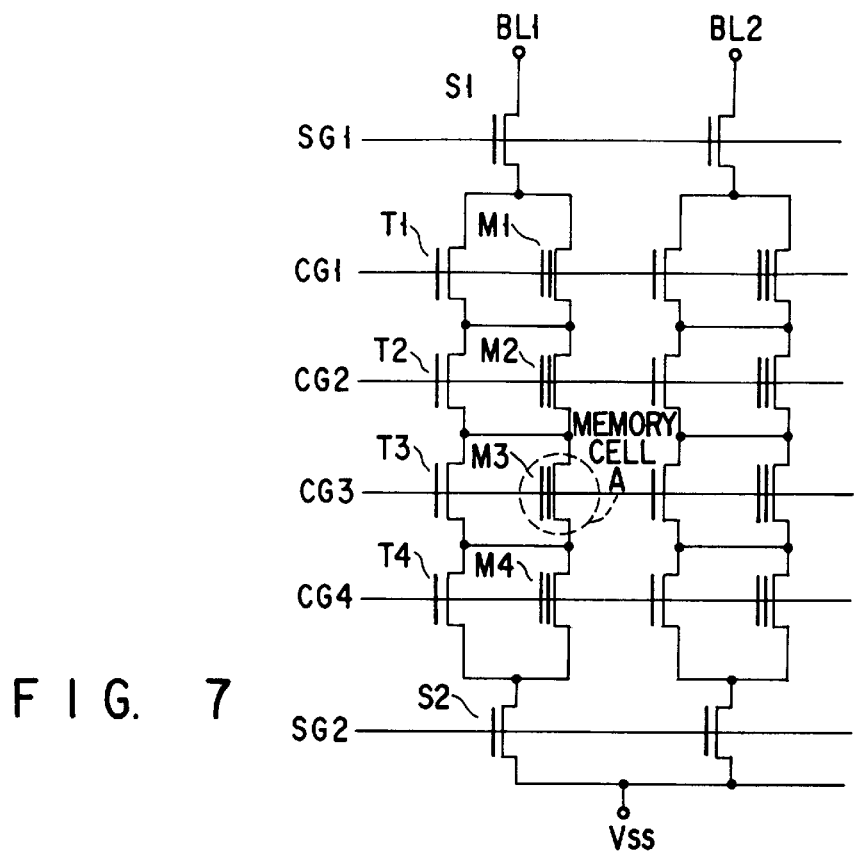
FIG. 7 is a circuit diagram of an equivalent circuit of memory cells of the first embodiment.

FIG. 7 is a circuit diagram of an equivalent circuit of NAND cell shown in FIGS. 5 through 6B. It will be appreciated that four cells are connected in series in FIG. 7. T1 through T4 denotes transfer transistors each having a channel arranged on a lateral side of a trench, whereas M1 through M4 denote memory cell sections formed on the substrate and each having a floating gate.

Table 1 below shows the operating voltages of various sections of the NAND cell of FIGS. 5 through 6B.

TABLE 1

|  | simultaneous erasure | selective programming | selective reading |
|---|---|---|---|
| BL1 | floating | 0 | 5V |
| BL2 | floating | Vpp/2 = Vm | 5V |
| SG1 | Vpp | Vm | 5V |
| SG2 | Vpp | 0V | 5V |
| CG1 | 0 | Vm | 5V |
| CG2 | 0 | Vpp | 0V |
| CG3 | 0 | Vm | 5V |
| CG4 | 0 | Vm | 5V |
| Vss | floating | 0V | 0V |
| Vp-well | Vpp | 0V | 0V |
| Vn-sub | Vpp | 0V | 0V |

Figure 8:
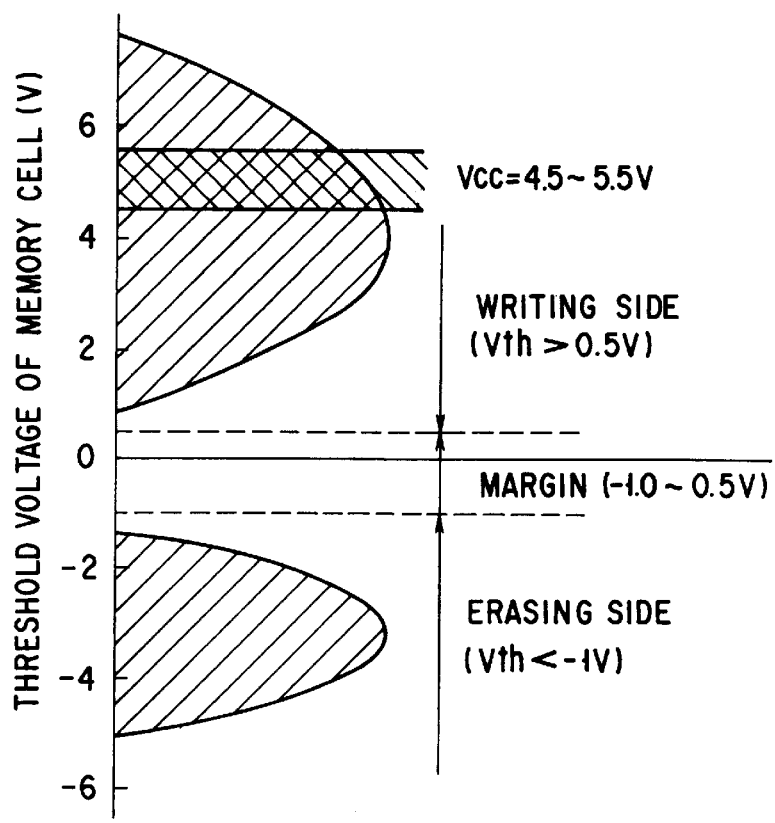
FIG. 8 is a graph showing a distribution pattern of threshold values of memory cells of the first embodiment.

FIG. 8 is a graph showing a distribution pattern of threshold values of memory cells of the embodiment. If the threshold voltage of the memory cell (or that of the floating gate) exceeds Vcc applied to the unselected gate, it does not need to be held back to between 0.5 and 3.5V because the transistor section (T1–T4) of the memory cell is ON (the threshold voltage of T1–T4 being between 0 and 4V). In FIG. 8, the threshold voltage is between 1 and 7V after a programming operation.

The threshold voltage of T1–T4 is found within the following range. The lower limit of the threshold voltage is defined by the voltage applied to the selected control gate at the time of reading operation, which is 0V in this case. The upper limit of the threshold voltage is defined by the voltage applied to the control gate at the time of reading operation, which is between 4.5 and 5.5V in this case. In other words, the threshold voltage has to be held between 0 and 4.5V.

The process of manufacturing a memory cell of the embodiment will now be described by referring to FIGS. 9A through 9E. Note that these drawings correspond to a cross sectional view taken along 6A—6A of FIG. 5.

Figure 9A:
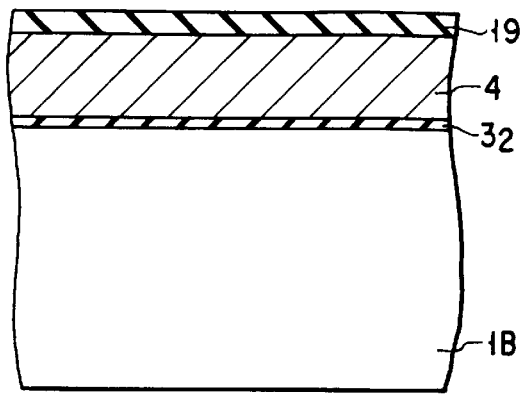
FIGS. 9A through 9E are cross sectional views of memory cells of the first embodiment, showing different manufacturing steps thereof.

As shown in FIG. 9A, a p-type well 1B having a surface boron concentration of $1 \times 10^{16}$ cm$^{-3}$ is formed on an n-type silicon substrate (not shown) and an appropriate channel is arranged by implantation in a region for forming a gate in order to control the threshold voltage. Then, a thermal oxide film (gate insulation film) is formed on the p-type well 1B typically to a thickness of 10 nm and a first polycrystalline silicon film 4 is formed by deposition for a gate electrode typically to a thickness of 400 nm. Thereafter, an oxide film (not shown) is formed on the polycrystalline silicon film 4 typically to a thickness of 18 nm and subsequently an oxide film 19 is deposited thereon by CVD typically to a thickness of 350 nm to that it may be used as a mask for trench RIE.

Figure 9B:
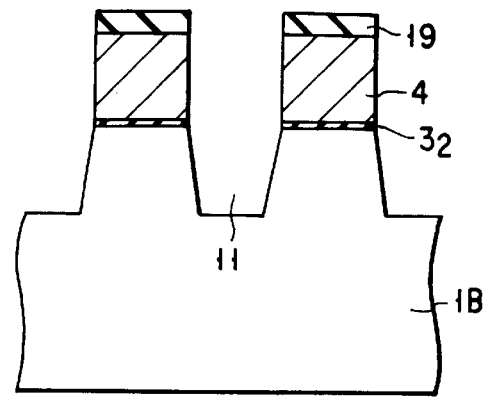

Then, as shown in FIG. 9B, after carrying out a patterning operation by photolithography to prepare a resist pattern for defining an element separating region, the CVD oxide film 19, the polycrystalline silicon film 4 and the gate oxide film 32 are selectively etched by anisotropic etching, using the obtained resist pattern (not shown). Additionally, the p-type well 1B surface is selectively etched by anisotropic etching to produce a trench 11. Alternatively, the CVD oxide film 19 through the silicon substrate may collectively be etched, using a resist pattern as a mask, which is eventually peeled off. Still alternatively, after etching the CVD oxide film 19, using a resist pattern as a mask, and subsequently peeling off the resist pattern, the polycrystalline silicon film 4, the gate oxide film 32 and the silicon substrate may be etched, using the CVD oxide film 19 as a mask.

Then, the product is subjected to heat treatment in a nitrogen or inert gas atmosphere to remedy the damage caused during the trench forming operation and the lateral walls of the trench are thermally oxidized in a hydrogen chloride atmosphere or in an oxidizing and moisture-containing atmosphere in order to protect the edges of the gate oxidation film 32.

Figure 9C:
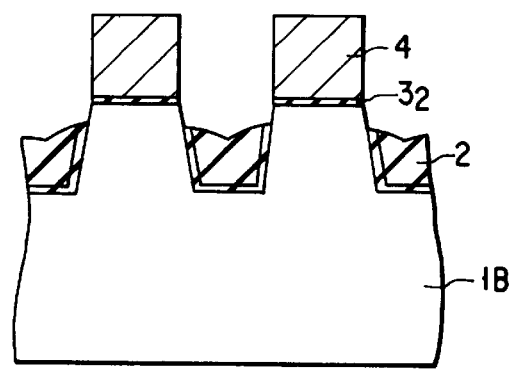

Subsequently, as shown in FIG. 9C, an $SiO_2$ film is deposited typically to a thickness of 1,000 nm by CVD using TEOS gas to fill the trench. Thereafter, the oxide film 2 is etched back by RIE until the polycrystalline silicon film 4 and part of the silicon substrate on the side walls of the trench are exposed. Note that the polycrystalline silicon film 4 acts as a stopper for the etching back operation. The etching back operation may be carried out by means of an etching back technique, using a resist or a combination of polishing.

Then, the polycrystalline silicon film 4 is doped with phosphorus until it shows a phosphor concentration of $1 \times 10^{20}$ cm$^{-3}$. This polycrystalline silicon doping operation may be carried out immediately after the formation of the polycrystalline silicon film 4 by deposition. Thereafter, boron (B) ions are injected into the film with 30 keV and $1 \times 10^{13}$ cm$^{-2}$ along an angle of inclination of 60-degree to obtain a threshold voltage of 2V for the trench side walls. Then, a silicon oxide film or an insulating film 33 such as an ONO film (Oxide-Nitride-Oxide film) is formed on the polycrystalline silicon film 4 and the trench side walls typically to a thickness of 20 nm. If this operation of oxidation is thermally conducted at 850 to 900 degrees temperature in a dry $O_2$ atmosphere, an oxide film is formed on the polycrystalline silicon film 4 to a thickness of about 10 to 20 nm, whereas the oxide film formed on the trench lateral walls shows a film thickness of about 40 nm. The oxide film operates on the floating gate as a capacitance film between it and the control gate, while it functions as a gate insulative film for the transfer transistor on the trench lateral sides.

Figure 9D:
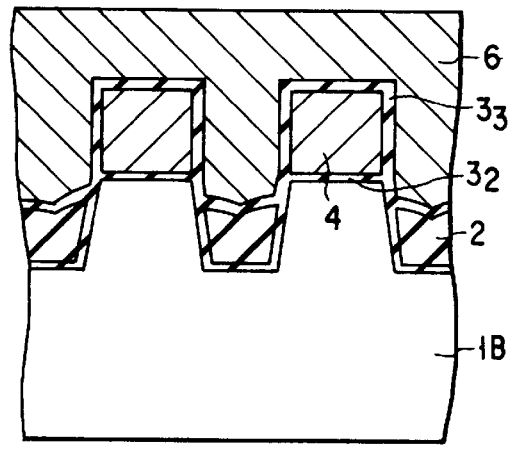

Then, as shown in FIG. 9D, a second polycrystalline silicon film 6 is formed typically to a thickness of 300 nm both on the cell section and on the peripheral section so that the film 6 operates as a control gate in the cell section and as a gate electrode in the peripheral section.

Figure 9E:
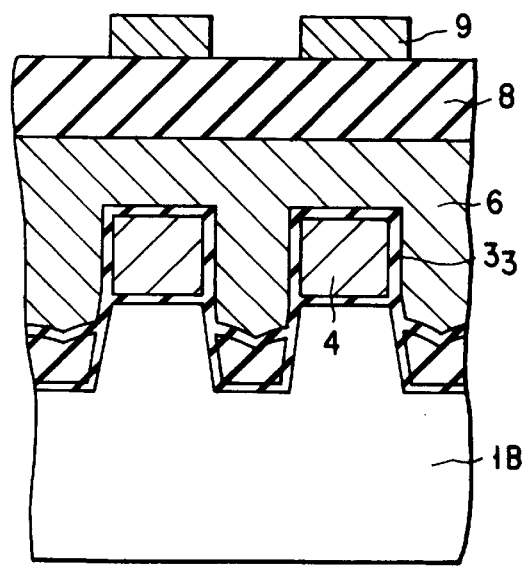

Subsequently, as shown in FIG. 9E, the second polycrystalline silicon film 6, the oxide film 8 and the first polycrystalline silicon film 4 are selectively etched by RIE, using a resist pattern having stripes running along the word lines, to separate the memory cell and the selected transistor along the word lines. Then, a source/drain diffusion layer is formed and entirely covered by a CVD oxide film before contact holes are bored and bit lines 9 are arranged, using an Al film, to complete the operation of manufacturing the memory cell.

Now, a second embodiment of the invention will be described by referring to FIG. 10.

With the embodiment of FIG. 10, an $SiO_2$ film filled in element separating trenches is deeply etched at every other trench to form channel sections on the lateral walls of the trenches for transfer transistors. By deeply etching the $SiO_2$ film only at a side of each control gate 30, the channel width of the transfer transistor can be controlled better if compared with the case where the both sides of the control gate are deeply etched.

FIG. 11 illustrates a third embodiment of the invention.

With the embodiment of FIG. 11, an $SiO_2$ film filled in each element separating trench is deeply etched only halfway along a transversal direction. The channel width of the transfer transistor can be controlled better by etching away only a half of the $SiO_2$ film to the bottom at each trench as in the case of FIG. 11.

A fourth embodiment of the invention will now be described by referring to FIGS. 12A through 12G.

While the insulative film between the floating gate and the control gate and the gate insulative film of the transfer transistor are formed in a same manufacturing step with each of the preceding embodiments, they are formed in different steps with the fourth embodiment.

Since the manufacturing steps of FIGS. 12A and 12B are the same as those of FIGS. 9A and 9B, they will not be described here any further. This embodiment differs from the first embodiment in that the manner in which a CVD $SiO_2$ film 12 filled in a trench is etched back. More specifically, the operation of RIE for etching back the film is so controlled as to be stopped at the lateral walls of the polycrystalline silicon film 4 as shown in FIG. 12C.

Figures 12D, 12E:
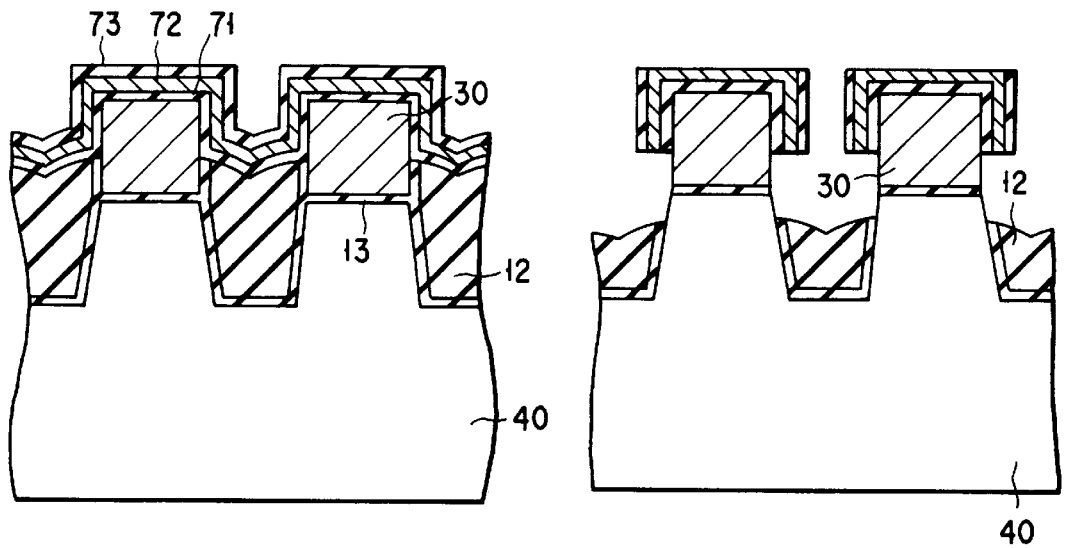

Thereafter, as shown in FIG. 12D, an insulative film which is typically an ONO film 71 is formed between the floating gate and the control gate to a thickness of 20 nm and then a polycrystalline silicon film 72 is deposited typically to a thickness of 50 nm, followed by deposition of an SiN film 73 which is an anti-oxidation film typically to a thickness of 30 . Note that the SiN film 73 is thick on the floating gate 4 and thin on the trench.

Then, as shown in FIG. 12E, the SiN film 73 on the element separating trench is removed by RIE. Note that the SiN film 73 is not totally removed from the area overlying the floating gate because it is thickly deposited there. Subsequently, the polycrystalline silicon film 72 and the ONO film 71 are etched out from the element separating trench and the buried $SiO_2$ layer is etched out from an upper portion of the trench 11.

Figures 12F, 12G:
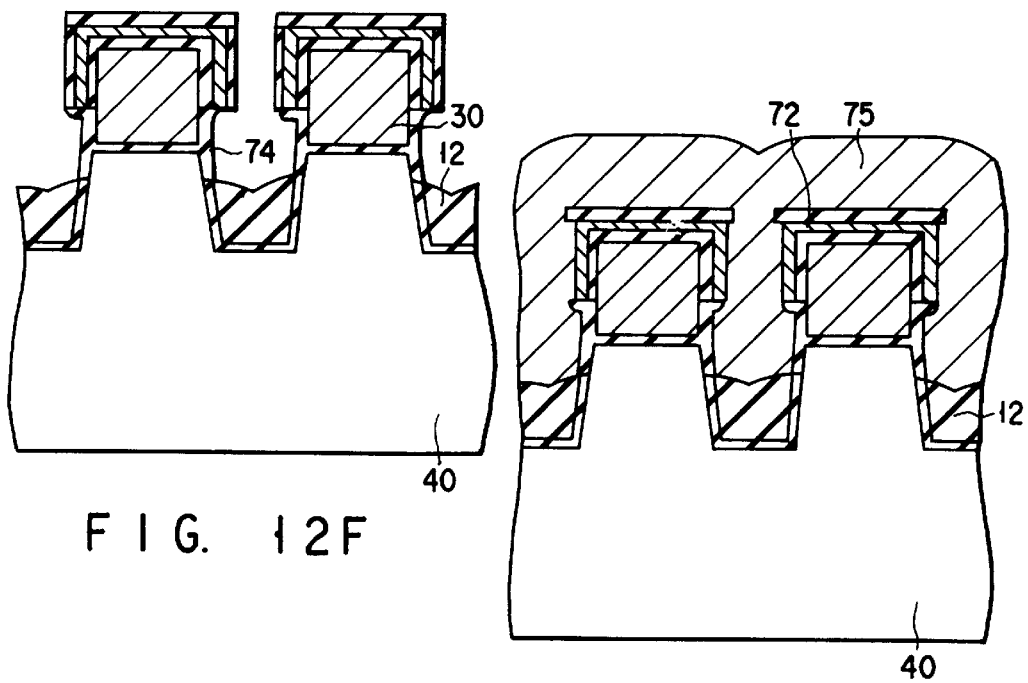

Then, as shown in FIG. 12F, a gate oxide film 74 is formed for the transfer transistor typically to a thickness of 50 nm by thermal oxidation and the SiN film 73 is selectively removed from the lateral walls of the floating gate 4 by means of, for instance, hot phosphoric acid.

Thereafter, as shown in FIG. 12G, a polycrystalline silicon film 75 is selectively formed by deposition to a thickness of 300 nm and then subjected to a doping operation. In this step, the polycrystalline silicon film 72 prepared in a preceding step and the polycrystalline silicon film 75 are electrically connected to provide a control gate. The subsequent steps are the same as those of the first embodiment.

The above described fourth embodiment is advantageous in that the insulation film separating the floating gate and the control gate and the transfer gate insulative film are formed separately to make the design of the transistors of the device easy.

Now, a fifth embodiment of the invention will be described by referring to FIGS. 13 and 14. The fifth embodiment is realized on a so called multiple-valued cell basis, wherein four memory levels are arranged within each cell.

Figure 13:
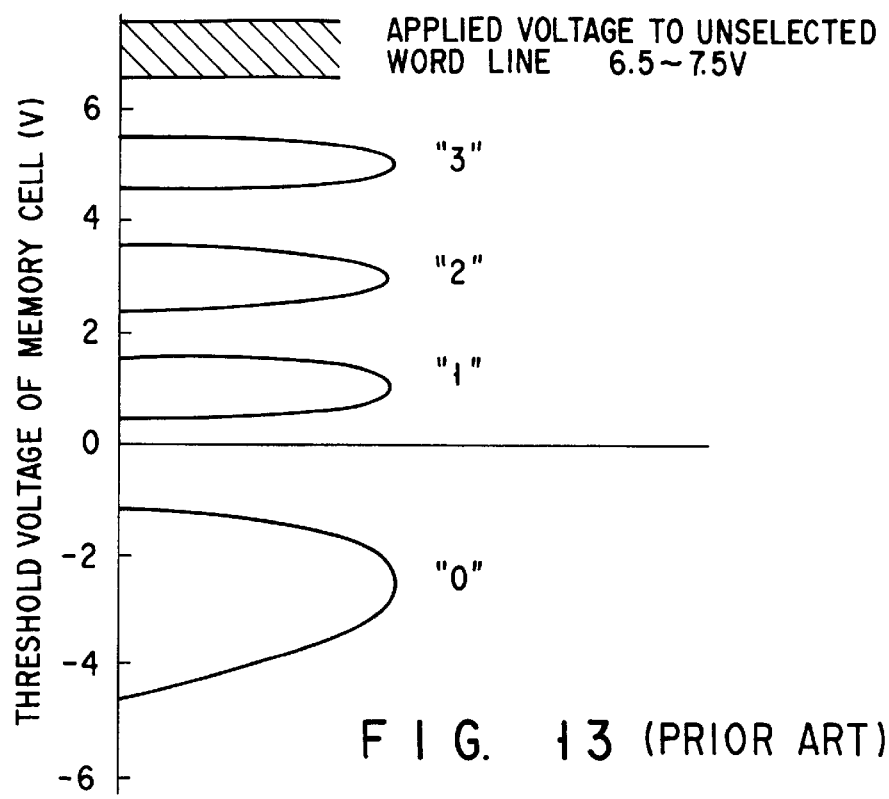
FIG. 13 is a graph showing a distribution pattern of threshold values of conventional memory cells, obtained by applying a multiple-valued logic.

FIG. 13 is a graph showing a distribution pattern of threshold values of conventional memory cells, obtained by applying a four-valued logic. The voltage of the conventional memory cell Vth is expressed by Vth<−1V at level "0", 0.5V<Vth<1.5V at level "1", 2.5V<Vth<3.5V at level "2" and 4.5V<Vth<5.5V at level "3". These value ranges are selected so that the selected memory cell becomes ON with a voltage applied to the unselected memory cell (CG) (6.5 to 7.5V in this case). The voltages for reading data are shown in Table 2 below.

TABLE 2

|  |  | "0"and"1" | "1"and"2" | "2"and"3" |
|---|---|---|---|---|
| Selected | BL1 | 5V | do | do |
| NAND | BL2 | 5V | " | " |
|  | SG1 | 5V | " | " |
|  | SG2 | 5V | " | " |
|  | CG1 | 6.5–7.5V | " | " |
|  | CG2 | 0V | 2.5V | 5V |
|  | CG3 | 6.5–7.5V | do | do |
|  | CG4 | 6.5–7.5V | " | " |
|  | Vss | 0V | " | " |
|  | Vp-well | 0V | " | " |
|  | Vn-well | 0V | " | " |
| Unselected | SG1' | 0V | " | " |
| NAND | SG2' | 0V | " | " |
|  | CG1' | 0V | " | " |
|  | CG2' | 0V | " | " |
|  | CG3' | 0V | " | " |
|  | CG4' | 0V | " | " |

FIG. 14 is a graph showing a distribution pattern of threshold values of memory cells of a fifth embodiment of the invention, obtained by applying a multiple-valued logic. It will be seen that the threshold voltage range for level "3" does not have to be made small for controllability because the transfer transistors (T1–T4) become ON if the threshold voltage of the memory cell is higher than the voltage range of 6.5–7.5V for unselected word lines. In this embodiment, it is between 5.5 and 9V. Consequently, a wide range can be selected for both the threshold voltage of level "1" and that of level "2". In this embodiment, the threshold voltage range is found between 0.5V and 1.5V for level "1" and between 3.0V and 4.5V for level "2", or wider by 0.5V if compared their conventional counterpart.

The threshold voltage for the transfer transistor is higher than 5V and lower than 6.5V in this embodiment. If it is lower than 5V, the transfer gate becomes ON if the threshold value of the floating gate is at level "3" and is taken for as level "2". If, on the other hand, it is higher than 6.5V, the transfer gate does not become ON when it is not selected so that the data stored in the selected cell cannot be read out. In other words, the threshold voltage of the transfer transistor should be higher than the voltage applied to the selected control gate of the selected NAND cell and lower than the voltage applied to the unselected control gate of the selected NAND cell when data is read out for determining if the correct level is level "2" or level "3".

While the above fifth embodiment of the invention is described in terms of four-valued logic cells, it will be clear that the present invention can also be applied to three-, eight-, sixteen- or higher valued logic cells. Assume here n-valued logic cells. Then, the threshold voltage of the transfer transistor needs to be defined to be higher than the voltage to be applied to the selected control gate of the selected NAND cell and lower than the voltage to be applied to the unselected control gate of the selected NAND cell.

Now, NOR type cells will be described below.

FIG. 15 is a plane view of a pair of NOR type cells and FIG. 16 is a circuit diagram of an equivalent circuit thereof, while FIGS. 17A and 17B are sectional views taken along lines 17A—17A and 17B—17B respectively. FIG. 18 is a graph showing a distribution pattern of threshold voltages of NOR type memory cells obtained by applying a four-valued logic.

The threshold voltage of the transfer transistor has to be higher than the control gate voltage for determining if the correct level is level "2" or level "3" or 6V. If it is lower than 6V, the transfer transistor becomes ON and no proper data cannot be read out. If the cells operate on an n-valued logic basis, the transfer transistor has to have a threshold voltage higher than the voltage to be applied to the selected control gate for the operation of reading data to determine if the correct level is the (n−1)th lowest level or the nth lowest level.

Figure 19:
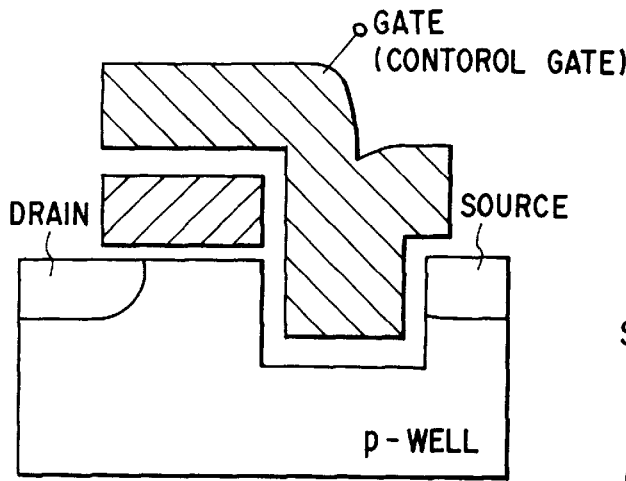
FIG. 19 is a schematic cross sectional view of a device obtained by burying the control gate of a serially arranged transistor into a trench of a proper transistor of a floating gate section.
Figure 20:
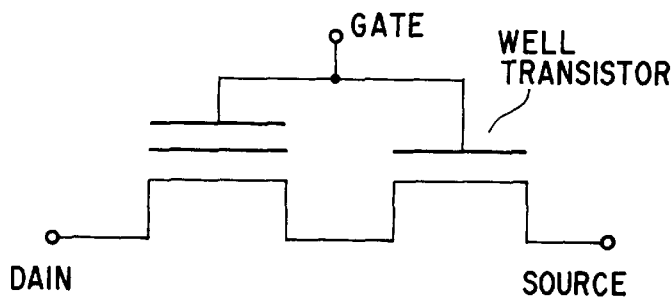
FIG. 20 is a circuit diagram of an equivalent circuit of the memory cells of FIG. 19.

FIG. 19 is a schematic cross sectional view of a device obtained by burying the gate electrode (control gate) of a serially arranged transistor into a trench of a proper transistor of a floating gate section formed on a substrate and FIG. 20 is a circuit diagram of an equivalent circuit of the memory cell of FIG. 19. The transistor formed in the trench and the memory cell (having the floating gate) transistor are connected in series. The cell may be an NOR type cell as shown in FIG. 15. If such is the case, the resistance against a phenomenon of punching through between the source and the drain can be improved so that the cell may be further downsized.

Figure 21:
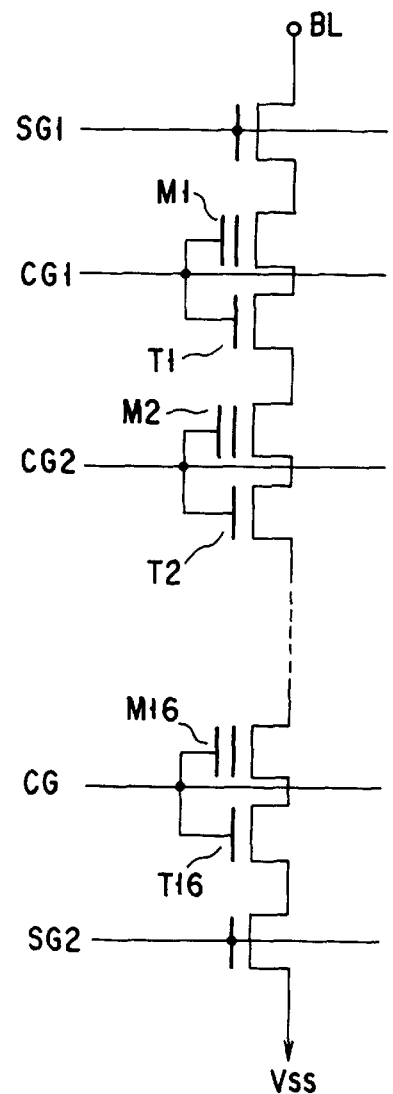
FIG. 21 is circuit diagram of an equivalent circuit of a NAND-type memory cell obtained by applying the configuration of FIG. 19.

While the entire trench of FIGS. 19 and 20 is filled with polysilicon of the control gate, only part of the trench may alternatively be filled with polysilicon. Still alternatively, the trench may partly be filled with polysilicon of the floating gate. FIG. 21 is a circuit diagram of an equivalent circuit obtained by using such cells in a NAND type arrangement.

Figure 23:
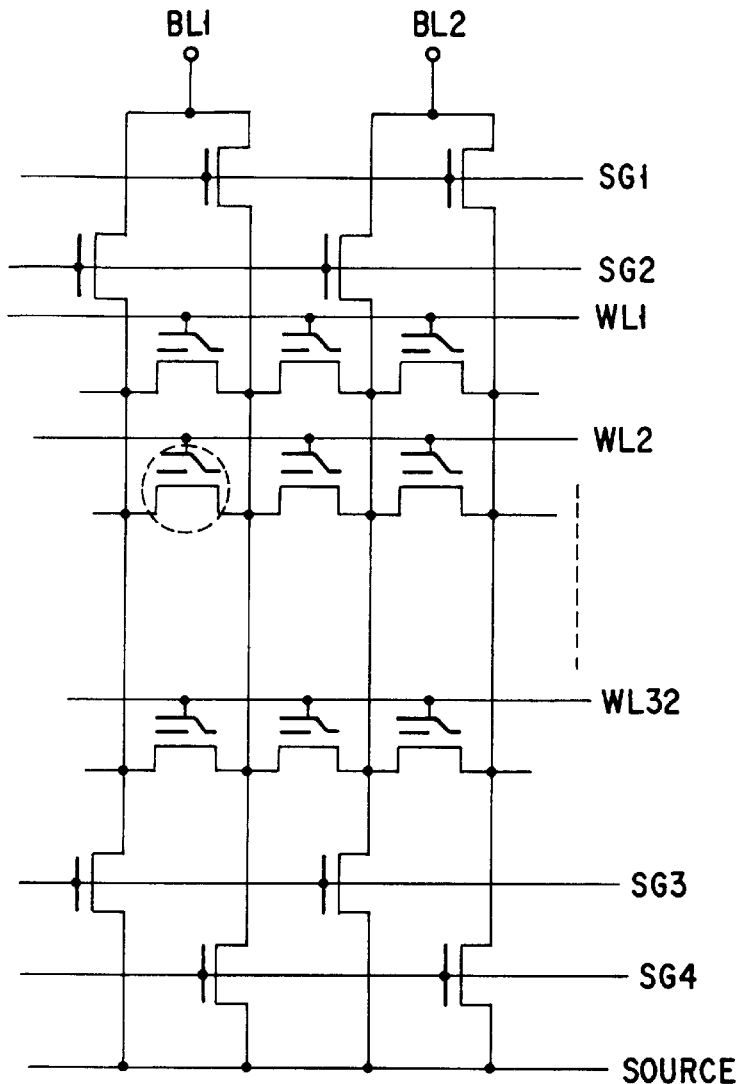
FIG. 23 is a circuit diagram of an equivalent circuit of the memory cells of FIG. 22.
Figure 24:
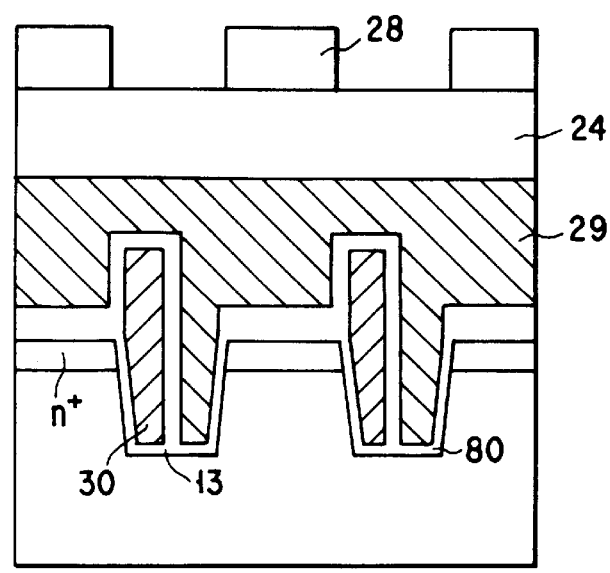
FIG. 24 is a cross sectional view taken along line 24—24 of FIG. 22.
Figures 29, 30:
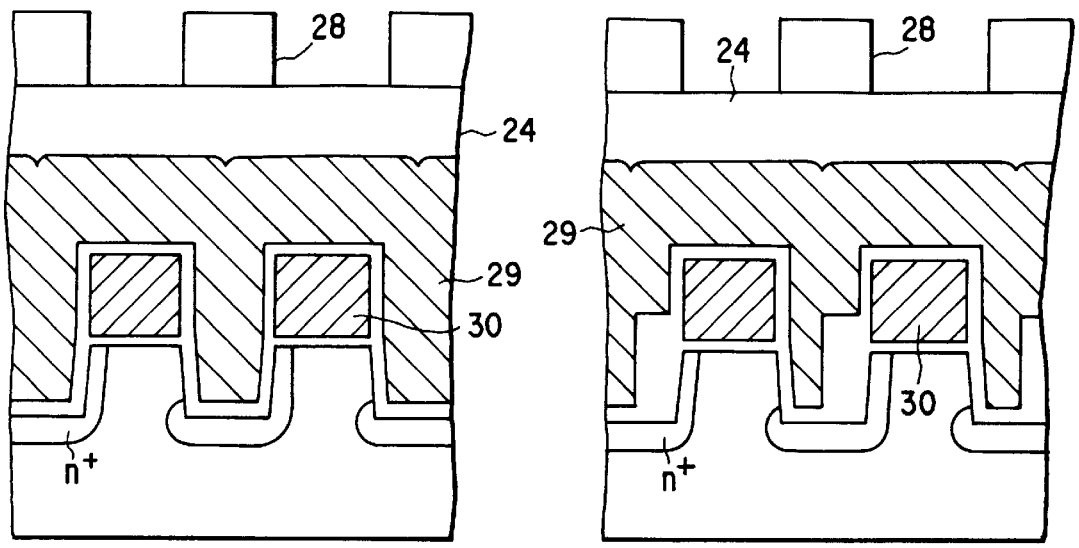
FIG. 29 is a cross sectional view of memory cells of still another device obtained by modifying the seventh embodiment of the invention.
FIG. 30 is a cross sectional view of memory cells of still another device obtained by modifying the seventh embodiment of the invention.

FIGS. 22 through 24 illustrate memory cells of a sixth embodiment of the invention realized by applying the concept of the invention to a grand array of memory cells, where a source and a drain are commonly used for memory cells having transfer transistors connected in series. FIG. 22 is a plan view and FIG. 23 is a circuit diagram of an equivalent circuit, while FIG. 24 is a sectional view taken along line 24—24 in FIG. 22. In FIG. 22, the shaded areas represent so many floating gates. In FIG. 24, a gate film 80 operates as an insulation film of a transistor having a control gate and a gate electrode buried in a trench.

Table 3 below shows the operating voltages of the above embodiment.

TABLE 3

|  | reading | erasing | programming |
|---|---|---|---|
| BL1 | 3V | 0V | 5V (or 0V) |
| BL2 | 0V | 0V | 0V (or 5V) |
| SG1 | 0V | 3V (15V) | 0V |
| SG2 | 3V | 3V (15V) | 5V |
| WL1 | 0V | 15V | 0V |
| WL2 | 3V | 15V | −10V |
| WL3 | 0V | 15V | −10V |
| ... | ... | ... | ... |
| WL32 | 0V | 15V | 0V |
| SG3 | 0V | 3V (15V) | 0V |
| SG4 | 3V | 3V (15V) | 0V |
| source | 0V | 0V | 0V |
| p-well | 0V | 0V | 0V |

The above values represent a case where the cell surrounded by a circle in FIG. 23 is selected.

Reading is detected by making an electric current flow into the source from BL1 by way of the cell. Erasing is carried out by injecting electrons into the floating gate. Writing is carried out by drawing electrons from the floating gate into the drain ($n^+$ in FIG. 24), applying a voltage to BL and WL2. For programming data, a voltage which electrons are not drawn and an erasing condition is maintained without applying 5V or 0V to BL is selected, thereby each of memory cells coupled to the same word line can be programmed simultaneously.

If memory cells are connected in parallel in the above described sixth embodiment and the threshold voltage of the cells are set to a level higher than the data reading voltage as in the preceding embodiments, no electric current would flow to the memory cells and no data can be read out of the memory cells. Thus, the threshold voltage of the memory cells has to be set to a level lower than the data reading voltage. Then, the advantages of the invention will be ensured for this embodiment. As described above, the threshold voltage can be controlled by implanting a channel into a lateral wall of the element separating trench. This method of controlling the threshold voltage can be applied to the memory cells of FIGS. 31 and 32, which will be described hereinafter.

As for NAND cells, if the cells operate on an n-valued logic basis, the threshold voltage needs to be defined to be higher than the voltage to be applied to the selected control gate of the selected NAND cell for the operation of reading data to determine if the correct level is the (n−1)th lowest level or the nth lowest level and lower than the voltage to be applied to the unselected control gate of the selected NAND cell. However, if cells are connected in parallel as in the case of NOR cells, the threshold voltage needs to be defined to be lower than the voltage to be applied to the control gate selected for the operation of reading data to determine if the correct level is the lowest level or the second lowest level and higher than the voltage to be applied to the control gate of the unread memory cell. To explain this operation by using an example of Table 3 of the operation of the sixth embodiment, since a voltage applied to the selected control gate in read operation for deciding the lowest level and the second level is 3V and a voltage applied to another word line which is not read is 3V, the threshold voltage Vth to be set becomes 0<Vth<3V.

FIGS. 25 through 30 illustrate a seventh embodiment of the invention in various modified forms. Note that the cells of this embodiment may be replaced by the cell section of the embodiment of FIGS. 22 through 24.

In the modified form of the embodiment of FIGS. 25 and 27, the floating gate is formed only in a bottom section of the trench and each lateral wall carries a transistor. In the modified form of the embodiment of FIG. 27, the n⁺ layer is extended at an end of the floating gate section. Then, in the modified form of the embodiment of FIG. 28, the floating gate is formed on the surface of the substrate. In each of the modified forms of the embodiment of FIGS. 29 and 30, the floating gate is formed on the surface of the substrate while the n⁺ layer is formed under the bottom of the trench.

Figure 31:
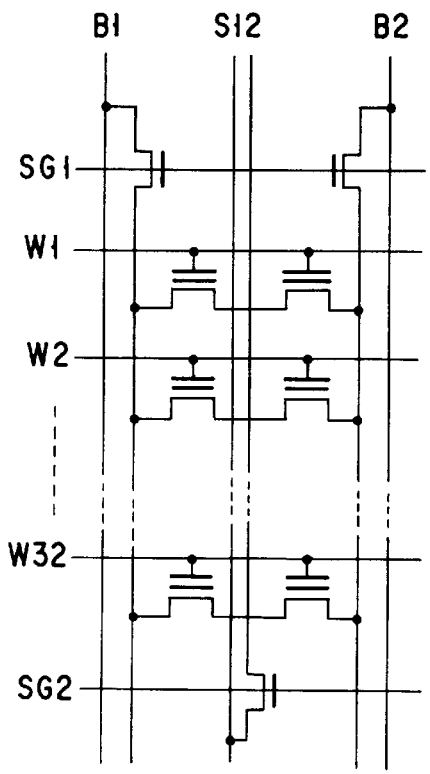
FIG. 31 is a circuit diagram of an equivalent circuit of a grand array of memory cells, where $n^+$ sections are separated from respective adjacent cells.
Figure 32:
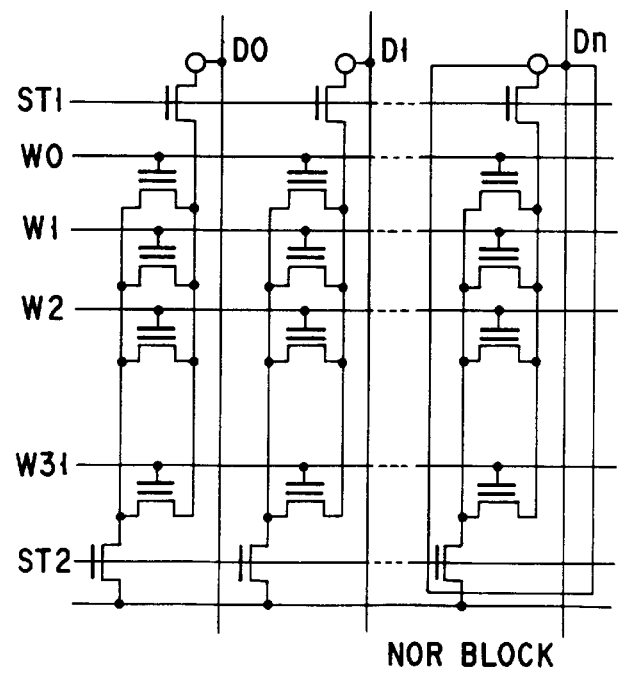
FIG. 32 is another circuit diagram of an equivalent circuit of a grand array of memory cells, where $n^+$ sections are separated from respective adjacent cells.
Figure 33:
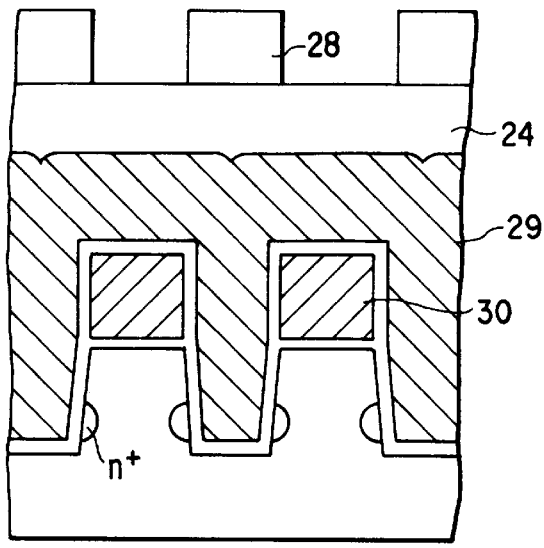
FIG. 33 is a cross sectional view of a set of memory cells for realizing the circuits of FIGS. 31 and 32.
Figure 34:
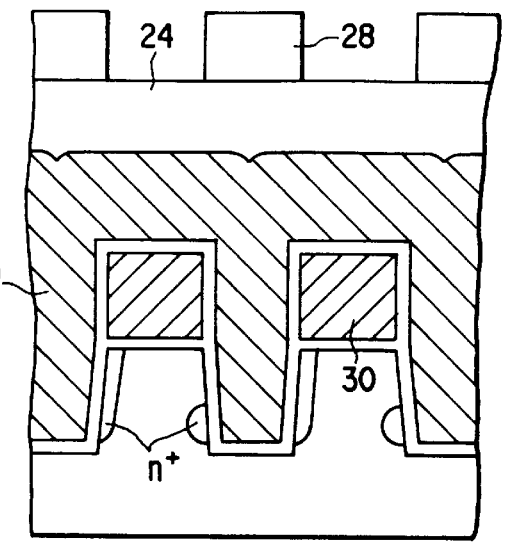
FIG. 34 is a cross sectional view of a different set of memory cells for realizing the circuits of FIGS. 31 and 32.
Figure 35:
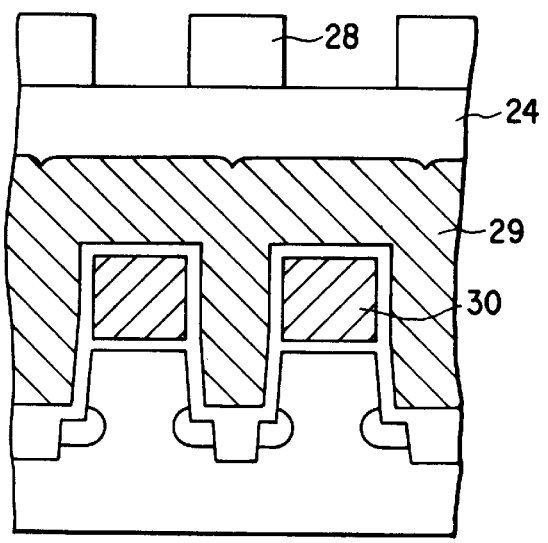
FIG. 35 is a cross sectional view of a still different set of memory cells for realizing the circuits of FIGS. 31 and 32.
Figure 36:
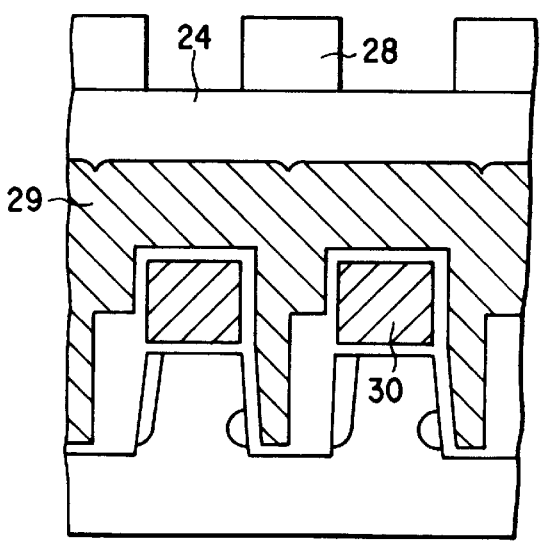
FIG. 36 is a cross sectional view of a still different set of memory cells for realizing the circuits of FIGS. 31 and 32.

FIGS. 31 and 32 are circuit diagrams of equivalent circuits for other modified forms, wherein the n⁺ is separated from the adjacent cells of a grand array. The circuits of FIGS. 31 and 32 represents the two pairs of modified forms of, for example, FIGS. 33 and 34 and FIGS. 35 and 36 respectively. In these modified forms, a pair of n⁺ sections are formed on the lateral walls of each trench to operate as the source and the drain respectively and separated from the adjacent n⁺ sections by trenches. These memory cells operate in a manner similar to the one shown in Table 3.

FIG. 37 shows an eighth embodiment of the invention. FIG. 38 is an array of memory cells of this embodiment. The erasing gate (EG) and the CG are arranged in parallel. Table 4 below shows the operating voltages of the above embodiment.

TABLE 4

|  | CG | EG | D | S |
|---|---|---|---|---|
| Program | 12V | 0V | 7V | 0V |
| Erase | 0V | 12V to 22V | 0V | 0V |
| Read | 5V | 0V | 1.5V | 0V |

In the "program" mode, the floating gate is electrically charged by injecting hot electrons. In the "erase" mode, electrons are drawn from the floating gate into the EG. With this arrangement, floating gates may be arranged on the lateral walls of trenches as in the case of FIGS. 22 through 30 to increase the effective gate length of both the floating gate section and the control gate section to bypass a phenomenon of punching through between the source and the drain can be improved so that the cell may be further downsized.

It would be appreciated that the present invention is not limited to the above embodiments.

While the present invention is described above mainly in terms of NAND cell type EEPROMs, a grand array type having the diffusion layer bit line and AND cell, it is not limited thereto and may be applied EEPROMs and EPROMs of various types. Specifically, it may be applied not only to control gate type EEPROMs but also to EEPROMs comprising MNOS type memory cells. Additionally, it may be applicable to so-called mask ROMs comprising MOS transistors that contain data programmed by channel ion injection and operate as memory cells.

The present invention may also be applicable to FACE type memory cells comprising diffusion layer bit lines as well as to DINOR type memory cells having sub-bit lines.

Finally, the present invention may be applied to a variety of memory devices other than those listed above without departing from the spirit and scope of the invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
   a semiconductor substrate;
   an array of a plurality of memory cells formed and arranged on said semiconductor substrate, each memory cell including a first transistor;
   element separating trenches arranged in at least part of each of said plurality of memory cells, each of said element separating trenches having an element separating insulative film and an electrically conductive film formed on said element separating insulative film;
   a second transistor arranged at a part of a first lateral side of each of said plurality of memory cells, and including said electrically conductive film as a control gate and diffusion layers of a source and a drain; and
   a third transistor arranged at a part of a second lateral side of each of said plurality of memory cells and including said electrically conductive film as a control gate and diffusion layers of a source and a drain, wherein
   said diffusion layers of sources and drains of said second and said third transistors are connected in parallel, and a threshold voltage of said second transistor is set to a first voltage which is higher than a second voltage applied to the control gate of the second transistor corresponding to a selected memory cell in a read operation.

2. A semiconductor memory device according to claim 1, wherein source and drain diffusion layers of said first transistor of said memory cell are shared and a plurality of said first transistors of said memory cells are connected in parallel.

3. A semiconductor memory device according to claim 2, wherein said plurality of memory cells connected in parallel are coupled to a data line via a common select transistor.

4. A semiconductor memory device according to claim 1, wherein source and drain diffusion layers of said first transistor of said memory cells are shared and a plurality of said first transistors of said memory cells are connected in series.

5. A semiconductor memory device according to claim 4, wherein said plurality of memory cells connected in parallel are coupled to a data line via a common select transistor.

6. A semiconductor memory device comprising:
a semiconductor substrate;
an array of a plurality of memory cells formed and arranged on said semiconductor substrate, each memory cell including a first transistor;
element separating trenches arranged in at least part of each of said plurality of memory cells, each of said element separating trenches having an element separating insulative film and an electrically conductive film formed on said element separating insulative film;
a second transistor arranged at a part of a first lateral side of each of said plurality of memory cells, and including said electrically conductive film as a control gate and diffusion layers of a source and a drain; and
a third transistor arranged at a part of a second lateral side of each of said plurality of memory cells and including said electrically conductive film as a control gate and diffusion layers of a source and a drain, wherein
said diffusion layers of sources and drains of said second and third transistors are shared,
said diffusion layers of sources and drains of said second and said third transistors are connected in series,
said second transistor, said third transistor, and said first transistor are connected in series, and
a threshold voltage of said second transistor is set to a first voltage which is lower than
a second voltage applied to the control gate of the second transistor corresponding to a selected memory cell in a read operation.

7. A semiconductor memory device according to claim 6, wherein source and drain diffusion layers of said first transistor of said memory cell are shared and a plurality of said first transistors of said memory cells are connected in parallel.

8. A semiconductor memory device according to claim 7, wherein said plurality of memory cells connected in parallel are coupled to a data line via a common select transistor.

9. A semiconductor memory device according to claim 6, wherein source and drain diffusion layers of said first transistor of said memory cells are shared and a plurality of said first transistors of said memory cells are connected in series.

10. A semiconductor memory device according to claim 9, wherein said plurality of memory cells connected in parallel are coupled to a data line via a common select transistor.

11. A non-volatile semiconductor memory device comprising:
a semiconductor substrate; and
an array of a plurality of memory cells formed and arranged on said semiconductor substrate, each memory cell including a first transistor having a control gate, each of said memory cells including a charge storage layer formed on said semiconductor substrate with a first insulative layer arranged therebetween and a first electrically conductive layer formed on said charge storage layer with a second insulative layer arranged therebetween; wherein
said semiconductor substrate includes element separating regions arranged between any two adjacent ones of said plurality of memory cells, each of said regions including an element separating trench therein in which is embedded in at least a portion of the trench an element separating insulative film, and in which is embedded a second electrically conductive layer in at least part of the remaining portion of the trench,
said charge storage layer is arranged above a first channel region of a surface of said semiconductor substrate and said first transistor is constructed by said first electrically conductive layer formed as said control gate,
said second electrically conductive layer is arranged above a second channel region at said part of the remaining portion of the trench, and a second transistor is constructed by said second electrically conductive layer formed as a second gate,
source and drain diffusion layers of said first transistor having said first channel region and said second transistor having said second channel region are shared and said first and second transistors are connected in parallel to construct said memory cell,
each of a plurality of said memory cells stores an n-level logic value (where n is a natural number) having 2 or more levels, and
a threshold voltage of said second transistor, which has said second channel region, having said second electrically conductive layer formed as a second gate is set to a first voltage which is higher than a second voltage applied to the second gate of the second transistor corresponding to a selected memory cell in a read operation for deciding a highest level of threshold value and a second highest level thereof.

12. A semiconductor memory device according to claim 11, wherein source and drain diffusion layers of said first transistor of said memory cell are shared and a plurality of said first transistors of said memory cells are connected in parallel.

13. A semiconductor memory device according to claim 12, wherein said plurality of memory cells connected in parallel are coupled to a data line via a common select transistor.

14. A semiconductor memory device according to claim 11, wherein number of said levels is 2.

15. A semiconductor memory device according to claim 11, wherein said storage layer is formed by a polysilicon film.

16. A semiconductor memory device according to claim 11, wherein said first and second insulative layers are formed by one of a silicon nitride film and $SiO_2$ film.

17. A non-volatile semiconductor memory device comprising:
a semiconductor substrate; and an array of a plurality of memory cells formed and arranged on said semiconductor substrate, each memory cell including a first transistor having a control gate, each of said memory cells including a charge storage layer formed on said semiconductor substrate with a first insulative layer arranged therebetween and a first electrically conductive layer formed on said charge storage layer with a second insulative layer arranged therebetween; wherein said semiconductor substrate includes element separating regions arranged between any two adjacent ones of said plurality of memory cells, each of said regions including an element separating trench therein in which is embedded in at least a portion of the trench an element separating insulative film, and in which is embedded a second electrically conductive layer in at least part of the remaining portion of the trench, said charge storage layer is arranged above a first channel region of a surface of said semiconductor substrate and said first transistor is constructed by said first electrically conductive layer formed as said control gate, said second electrically conductive layer is arranged above a second channel region at said part of the remaining portion of the trench, and a second transistor is constructed by said second electrically conductive layer formed as a second gate, source and drain diffusion layers of said first transistor having said first channel region and said second transistor having said second channel region are shared and said first and second transistors are connected in parallel to construct said memory cell, source and drain diffusion layers of adjacent memory cells of said memory cells are shared and a plurality of memory cells are connected in series to construct NAND cell, each of a plurality of said memory cells stores an n-level logic value (where n is a natural number) having 2 or more levels, and a threshold voltage of said second transistor, which has said second channel region, having said second electrically conductive layer formed as a second gate is set to a first voltage which is higher than a second voltage applied to the second gate of the second transistor corresponding, to a selected memory cell in a read operation for deciding a highest level of threshold value and a second highest level thereof and is set to a third voltage which is lower than a fourth voltage applied to a control gate of an unselected memory cell of a selected NAND cell in a read operation.

18. A semiconductor memory device according to claim 17, wherein said plurality of memory cells connected in series are coupled to a data line via a common select transistor.

19. A semiconductor memory device according to claim 17, wherein number of said levels is 2.

20. A semiconductor memory device according to claim 17, wherein said storage layer is formed by a polysilicon film.

21. A semiconductor memory device according to claim 17, wherein said first and second insulative layers are formed by one of a silicon nitride film and SiO$_2$ film.

22. A non-volatile semiconductor memory device comprising:
a semiconductor substrate, and
an array of a plurality of memory cells formed and arranged on said semiconductor substrate, each memory cell including a first transistor having a control gate, each of said memory cells including a charge storage layer formed on said semiconductor substrate with a first insulative layer arranged therebetween and a first electrically conductive layer formed on said charge storage layer with a second insulative layer arranged therebetween; wherein said semiconductor substrate includes element separating regions arranged between any two adjacent ones of said plurality of memory cells, each of said regions including an element separating trench therein in which is embedded in at least a portion of the trench an element separating insulative film, and in which is embedded a second electrically conductive layer in at least part of the remaining portion of the trench, said charge storage layer is arranged above a first channel region of a surface of said semiconductor substrate and said first transistor is constructed by said first electrically conductive layer formed as said control gate, said second electrically conductive layer is arranged above a second channel region at said part of the remaining portion of the trench, and a second transistor is constructed by said second electrically conductive layer formed as a second gate, source and drain diffusion layers of said first transistor having said first channel region and said second transistor having said second channel region are shared and said first and second transistors are connected in series to construct said memory cell, each of a plurality of said memory cells stores an n-level logic value (where n is a natural number) having 2 or more levels, and a threshold voltage of said second transistor, which has said second channel region, having said second electrically conductive layer formed as a second gate is set to a first voltage which is lower than a second voltage applied to the second gate of the second transistor corresponding to a selected memory cell in a read operation for deciding a lowest level of threshold value and a second lowest level thereof.

23. A semiconductor memory device according to claim 22, wherein source and drain diffusion layers of said first transistor of said memory cell are shared and a plurality of said first transistors of said memory cells are connected in series.

24. A semiconductor memory device according to claim 23, wherein said plurality of memory cells connected in parallel are coupled to a data line via a common select transistor.

25. A semiconductor memory device according to claim 22, wherein number of said levels is 2.

26. A semiconductor memory device according to claim 22, wherein said storage layer is formed by a polysilicon film.

27. A semiconductor memory device according to claim 22, wherein said first and second insulative layers are formed by one of a silicon nitride film and multilayered film of silicon nitride film and SiO$_2$ film.

28. A non-volatile semiconductor memory device comprising:
a semiconductor substrate; and
an array of a plurality of memory cells formed and arranged on said semiconductor substrate, each memory cell including a first transistor having a control gate, each of said memory cells including a charge storage layer formed on said semiconductor substrate with a first insulative layer arranged therebetween and a first electrically conductive layer formed on said charge storage layer with a second insulative layer arranged therebetween; wherein said semiconductor substrate includes element separating regions arranged between any two adjacent ones of said plurality of memory cells, regions including an element separating trench in which is embedded in at least a portion of the trench an element separating insulative film, and in which is embedded a second electrically conductive layer in at least part of the remaining portion of the trench, said charge storage layer is arranged above a first channel region of a surface of said semiconductor substrate in a direction of a channel width and a first transistor is constructed by said first electrically conductive layer formed as a control gate, said second electrically conductive layer is arranged above a second channel region at said part of the remaining portion of the trench, and a second transistor is constructed by said second electrically conductive layer formed as a second gate, source and drain diffusion layers of said first transistor having said first channel region and said second transistor having said second channel region are shared and said first and second transistors are connected in series to construct said memory cell, source and drain diffusion layers of adjacent memory cells of said memory cells are shared and a plurality of memory cells are connected in parallel, each of a plurality of said memory cells stores an n-level logic value (wherein n is a natural number) having 2 or more levels, and a threshold voltage of said second transistor, which has said second channel region, having said second electrically conductive layer formed as a second gate is set to a first voltage which is lower than a second voltage applied to the second gate of the second transistor corresponding to a selected memory cell in a read operation for deciding a lowest level of threshold value and a second lowest level thereof and is set to a third voltage which is higher than a fourth voltage applied to a control gate of an unselected memory cell.

29. A semiconductor memory device according to claim 28, wherein said plurality of memory cells connected in parallel are coupled to a data line via a common select transistor.

30. A semiconductor memory device according to claim 28, wherein number of said levels is 2.

31. A semiconductor memory device according to claim 28, wherein said storage layer is formed by a polysilicon film.

32. A semiconductor memory device according to claim 28, wherein said first and second insulative layers are formed by one of a silicon nitride film and multilayered film of silicon nitride film and $SiO_2$ film.

* * * * *